(12) United States Patent
Sun et al.

(10) Patent No.: US 11,239,247 B2
(45) Date of Patent: Feb. 1, 2022

(54) MEMORY DEVICE AND METHOD FOR FORMING THE SAME

(71) Applicant: Yangtze Memory Technologies Co., Ltd., Wuhan (CN)

(72) Inventors: Zhongwang Sun, Wuhan (CN); Rui Su, Wuhan (CN); Zhong Zhang, Wuhan (CN); Wenxi Zhou, Wuhan (CN); Zhiliang Xia, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 90 days.

(21) Appl. No.: 16/900,511

(22) Filed: Jun. 12, 2020

(65) Prior Publication Data

US 2021/0366917 A1 Nov. 25, 2021

Related U.S. Application Data

(63) Continuation of application No. PCT/CN2020/092101, filed on May 25, 2020.

(51) Int. Cl.
*H01L 27/1157* (2017.01)
*H01L 27/11582* (2017.01)
*H01L 27/11556* (2017.01)
*H01L 27/11524* (2017.01)

(52) U.S. Cl.
CPC .... *H01L 27/1157* (2013.01); *H01L 27/11524* (2013.01); *H01L 27/11556* (2013.01); *H01L 27/11582* (2013.01)

(58) Field of Classification Search
None
See application file for complete search history.

(56) References Cited

U.S. PATENT DOCUMENTS

| 7,163,891 B2 | 1/2007 | Maldei et al. |
| 7,265,051 B2 | 9/2007 | Kim et al. |
| 2021/0066338 A1* | 3/2021 | Otaguro ............ H01L 27/11565 |

FOREIGN PATENT DOCUMENTS

| CN | 109935547 A | 6/2019 |
| CN | 110911417 A | 3/2020 |
| CN | 110931500 A | 3/2020 |
| CN | 111180452 A | 5/2020 |

\* cited by examiner

*Primary Examiner* — Hsien Ming Lee
(74) *Attorney, Agent, or Firm* — Anova Law Group, PLLC

(57) ABSTRACT

Memory device includes a bottom-select-gate (BSG) structure including cut slits vertically through the BSG structure, on a substrate. A cell-layers structure is formed on the BSG structure. Gate-line slits are formed vertically through the cell-layers structure and the BSG structure, into the substrate and arranged along a first lateral direction to distinguish finger regions. A first gate-line slit is between first and second finger regions and includes gate-line sub-slits. The first finger region is divided into a first string region and a second string region by a first cut-slit, formed in the first finger region along a second lateral direction and further extended into at least the second finger region along the first lateral direction. At least one BSG defined by the first cut-slit is located in at least the second finger region to connect to cell strings in the first string region through an inter-portion between adjacent gate-line sub-slits.

20 Claims, 18 Drawing Sheets

MEMORY DEVICE AND METHOD FOR FORMING THE SAME

CROSS-REFERENCE TO RELATED APPLICATION

This application is a continuation of International Application No. PCT/CN2020/092101, filed on May 25, 2020, the entire content of which is incorporated herein by reference.

FIELD

This application generally relates to the field of memory technologies and, more specifically, to a memory device and a method for forming the same.

BACKGROUND

Staircase structures are often used in 3-dimensional memory devices, such as NAND memory devices. A staircase structure may include many stairs of electrodes. Vertical contacts may be formed on the stairs to electrically connect to corresponding electrodes. Bottom select gates are electrodes used to select NAND strings and stairs of bottom select gates are at a bottom of a staircase structure.

SUMMARY

One aspect of the present disclosure includes a memory device. The memory device includes a bottom-select-gate (BSG) structure, including cut slits formed vertically through the BSG structure, on a substrate. A cell-layers structure is formed on the BSG structure. Gate-line slits are formed vertically through the cell-layers structure and the BSG structure, into the substrate and arranged along a first lateral direction to distinguish a plurality of finger regions. The gate-line slits include a first gate-line slit between first and second finger regions of the plurality of finger regions, the first gate-line slit including gate-line sub-slits. The first finger region is divided into a first string region and a second string region by a first cut-slit of the cut slits. The first cut-slit is formed in the first finger region extending along a second lateral direction and further extended into at least the second finger region along the first lateral direction. At least one BSG defined by the first cut-slit is located in at least the second finger region to connect to cell strings in the first string region through an inter-portion between adjacent gate-line sub-slits of the first gate-line slit.

Optionally, the cut slits further include a second cut-slit formed in the second finger region and connecting to a gate-line sub-slit of the first gate-line slit. The second cut-slit defines another at least one BSG located in at least the second finger region to connect to cell strings in the second string region of the first finger region through a corresponding inter-portion between corresponding adjacent gate-line sub-slits of the first gate-line slit. The second cut-slit is further extended into another finger region of the plurality of finger regions along the first lateral direction to further provide an additional BSG located in the another finger region to connect to the cell strings in the second string region of the first finger region.

Optionally, the first cut-slit is further extended into another finger region of the plurality of finger regions along the first lateral direction to further provide an additional BSG located in the another finger region to connect to the cell strings in the first string region.

Optionally, each finger region of the plurality of finger regions is divided into two or more string regions.

Optionally, the memory device further includes dummy channels, formed in the plurality of finger regions over the substrate; and contacts, formed on BSGs of the BSG structure in the plurality of finger regions excluding the first finger region.

Optionally, the first finger region is defined between a continuous gate-line slit and the first gate-line slit including the gate-line sub-slits, and a wall structure is formed in the first finger region over the substrate. The wall structure includes a stack structure of alternating electrode/insulating layer pairs.

Optionally, an additional gate-line sub-slit is formed within a finger region connecting to one or more cut slits to form corresponding string regions.

Optionally, the memory device further includes another BSG structure. The substrate includes a staircase-structure region and a doped well is formed in the staircase-structure region of the substrate. The BSG structure and the another BSG structure are formed on the staircase-structure region of the substrate symmetrically based on the doped well. A top of the BSG structure and a top of the another BSG structure have different heights from the substrate. The substrate further includes a first array region and a second array region, and the staircase-structure region is between the first array region and the second array region, arranged along the second lateral direction.

Optionally, the cell-layers structure includes a stack structure of alternating electrode/insulating layer pairs.

Optionally, the memory device further includes an insulating material formed in the cut slits.

Another aspect of the present disclosure includes a method for forming a memory device. A bottom-select-gate (BSG) structure is formed on a substrate. Cut slits are formed vertically through the BSG structure on the substrate. A cell-layers structure is formed on the BSG structure. Gate-line slits that are vertically through the cell-layers structure and the BSG structure, into the substrate and arranged along a first lateral direction to distinguish a plurality of finger regions are formed. The gate-line slits include a first gate-line slit between first and second finger regions of the plurality of finger regions, the first gate-line slit including gate-line sub-slits. The first finger region is divided into a first string region and a second string region by a first cut-slit of the cut slits. The first cut-slit is formed in the first finger region along a second lateral direction and further extended into at least the second finger region along the first lateral direction. At least one BSG defined by the first cut-slit is located in at least the second finger region to connect to cell strings in the first string region through an inter-portion between adjacent gate-line sub-slits of the first gate-line slit.

Optionally, the cut slits further include a second cut-slit formed in the second finger region and connecting to a gate-line sub-slit of the first gate-line slit. The second cut-slit defines another at least one BSG located in at least the second finger region to connect to cell strings in the second string region of the first finger region through a corresponding inter-portion between corresponding adjacent gate-line sub-slits of the first gate-line slit. The second cut-slit is further extended into another finger region of the plurality of finger regions along the first lateral direction to further provide an additional BSG located in the another finger region to connect to the cell strings in the second string region of the first finger region.

Optionally, the first cut-slit is further extended into another finger region of the plurality of finger regions along the first lateral direction to further provide an additional BSG located in the another finger region to connect to the cell strings in the first string region.

Optionally, each finger region of the plurality of finger regions is divided into two or more string regions.

Optionally, dummy channels are formed in the plurality of finger regions over the substrate; and contacts are formed on BSGs in the plurality of finger regions excluding the first finger region.

Optionally, the first finger region is defined between a continuous gate-line slit and the first gate-line slit including the gate-line sub-slits, and a wall structure is formed in the first finger region over the substrate. The wall structure includes a stack structure of alternating electrode/insulating layer pairs.

Optionally, an additional gate-line sub-slit is formed within a finger region connecting to one or more cut slits to form corresponding string regions.

Optionally, another BSG structure is formed. The substrate includes a staircase-structure region and a doped well is formed in the staircase-structure region of the substrate. The BSG structure and the another BSG structure are formed on the staircase-structure region of the substrate symmetrically based on the doped well. A top of the BSG structure and a top of the another BSG structure have different heights from the substrate. The substrate further includes a first array region and a second array region, and the staircase-structure region is between the first array region and the second array region, arranged along the second lateral direction.

Optionally, the cell-layers structure includes a stack structure of alternating electrode/insulating layer pairs before forming the gate-line slits.

Optionally, an insulating material is deposited in the cut slits.

Other aspects of the present disclosure can be understood by those skilled in the art in light of the description, the claims, and the drawings of the present disclosure.

DETAILED DESCRIPTION OF EMBODIMENTS

The following describes the technical solutions in the embodiments of the present invention with reference to the accompanying drawings. Wherever possible, the same reference numbers will be used throughout the drawings to refer to the same or like parts. Apparently, the described embodiments are merely some but not all the embodiments of the present invention. Other embodiments obtained by a person skilled in the art based on the embodiments of the present invention without creative efforts shall fall within the protection scope of the present disclosure.

In the specification, claims, and accompanying drawings of the present disclosure, the terms "first," "second," "third," "fourth," and the like (if exist) are intended to distinguish between similar objects but do not necessarily indicate an order or sequence. It should be understood that the embodiments of the present disclosure described herein can be implemented, for example, in orders other than the order illustrated or described herein.

Some or all of the processes may be chosen according to actual needs to achieve purposes of the present disclosure. Some or all of the components may be chosen according to actual needs to achieve purposes of the present disclosure.

The terms "one or more" or the like as used herein may be used to describe any feature, structure, or characteristic in a singular sense and/or may be used to describe combinations of features, structures or characteristics in a plural sense. Similarly, terms "a," "an," and "the," or the like may be used to convey a singular usage and/or to convey a plural usage.

It should be understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatial terms "beneath," "below," "lower," "above," "upper," "top," "bottom," and the like, may be used herein for ease of description to describe one element or feature's relationship to another element(s) or feature(s) as illustrated in the figures. The spatial terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
FIG. 1 illustrates a schematic view of an exemplary three-dimensional (3D) memory device according to various embodiments of the present disclosure.
Figure 2:
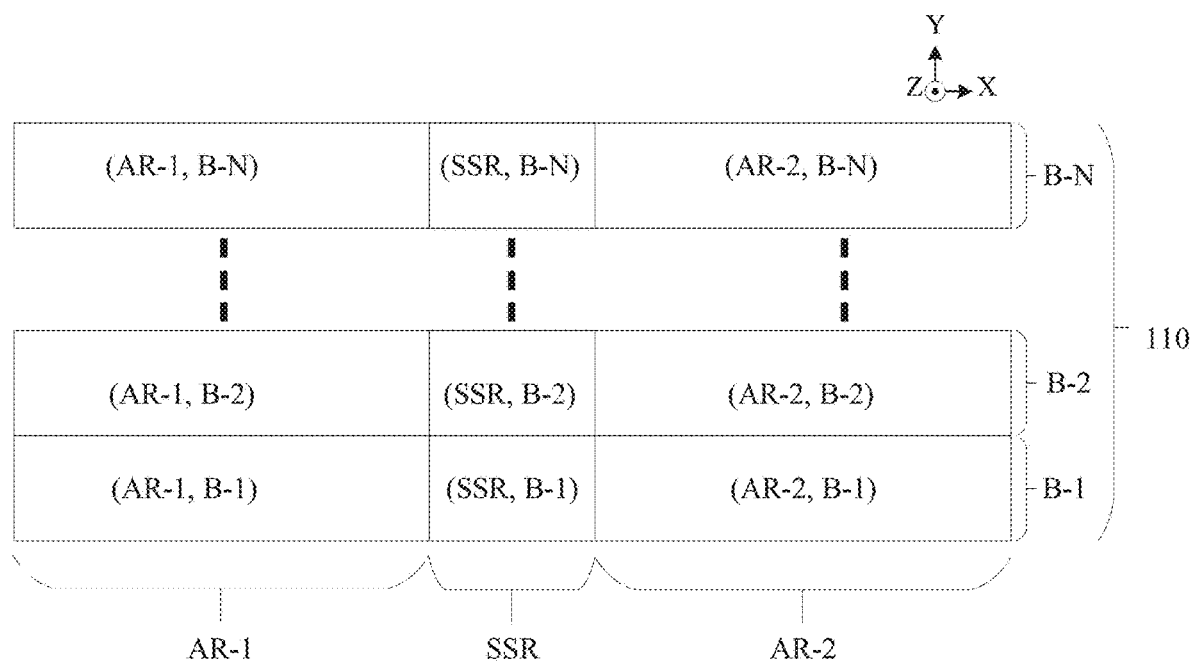
FIG. 2 illustrates a schematic view of a first semiconductor structure of an exemplary 3D memory device according to various embodiments of the present disclosure.
Figure 3:
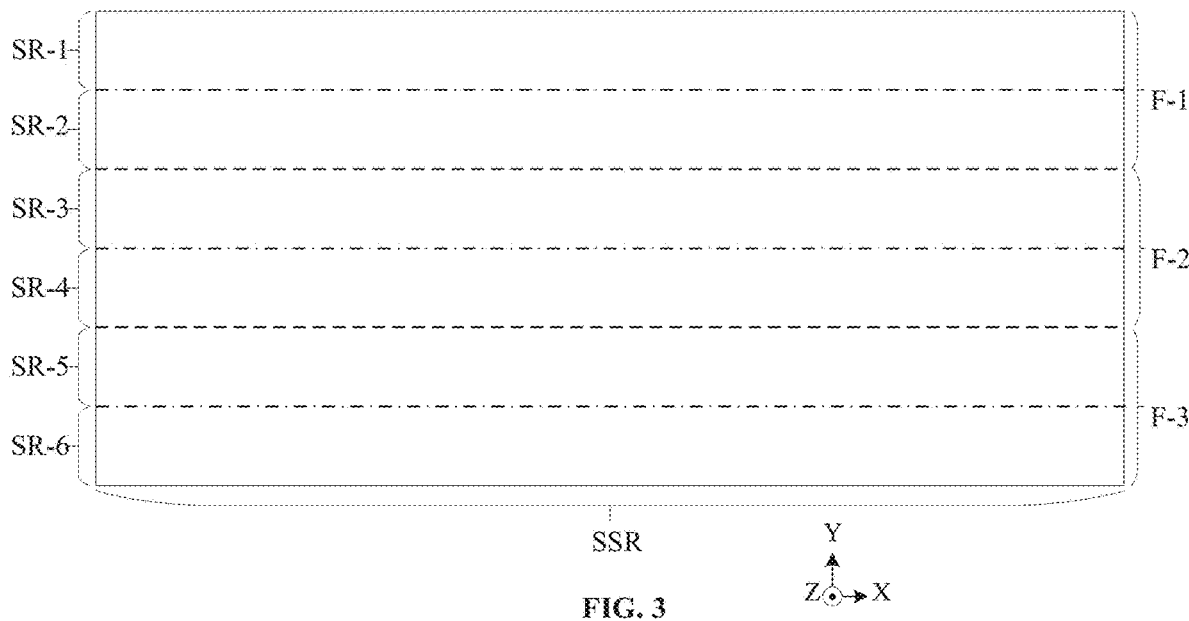
FIGS. 3 and 4 illustrate schematic views of an exemplary staircase-structure region in a block of an 3D memory device according to various embodiments of the present disclosure.
Figure 4:
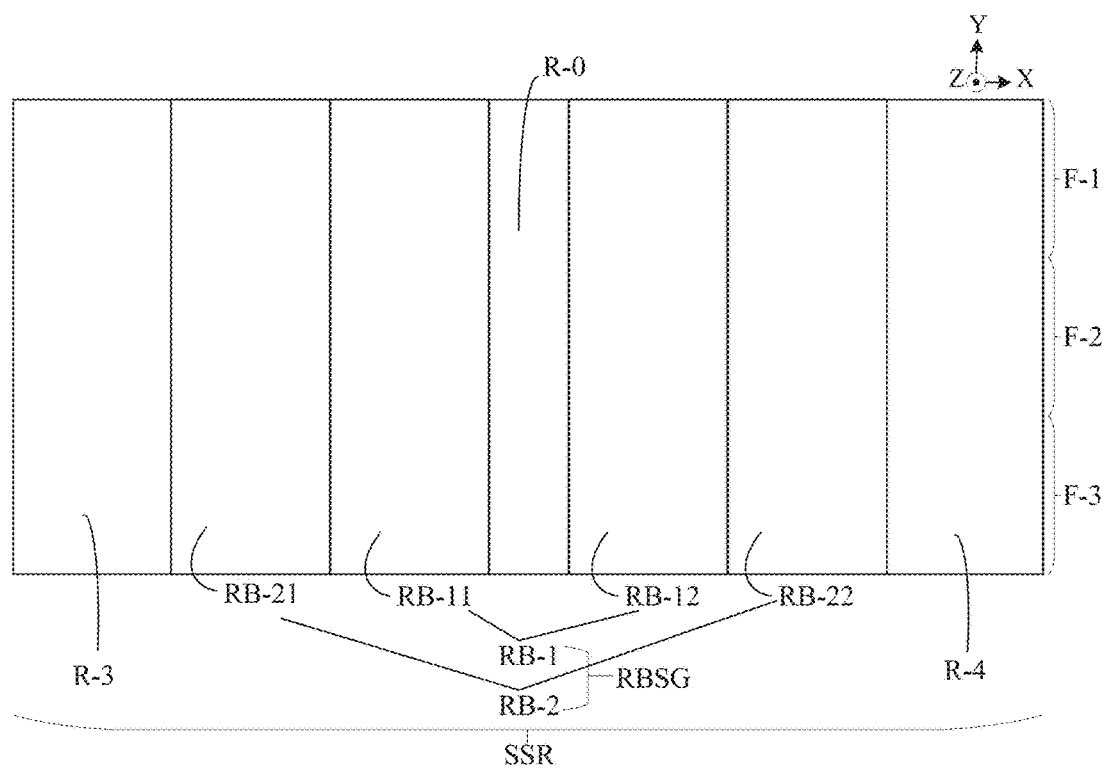
Figure 5:
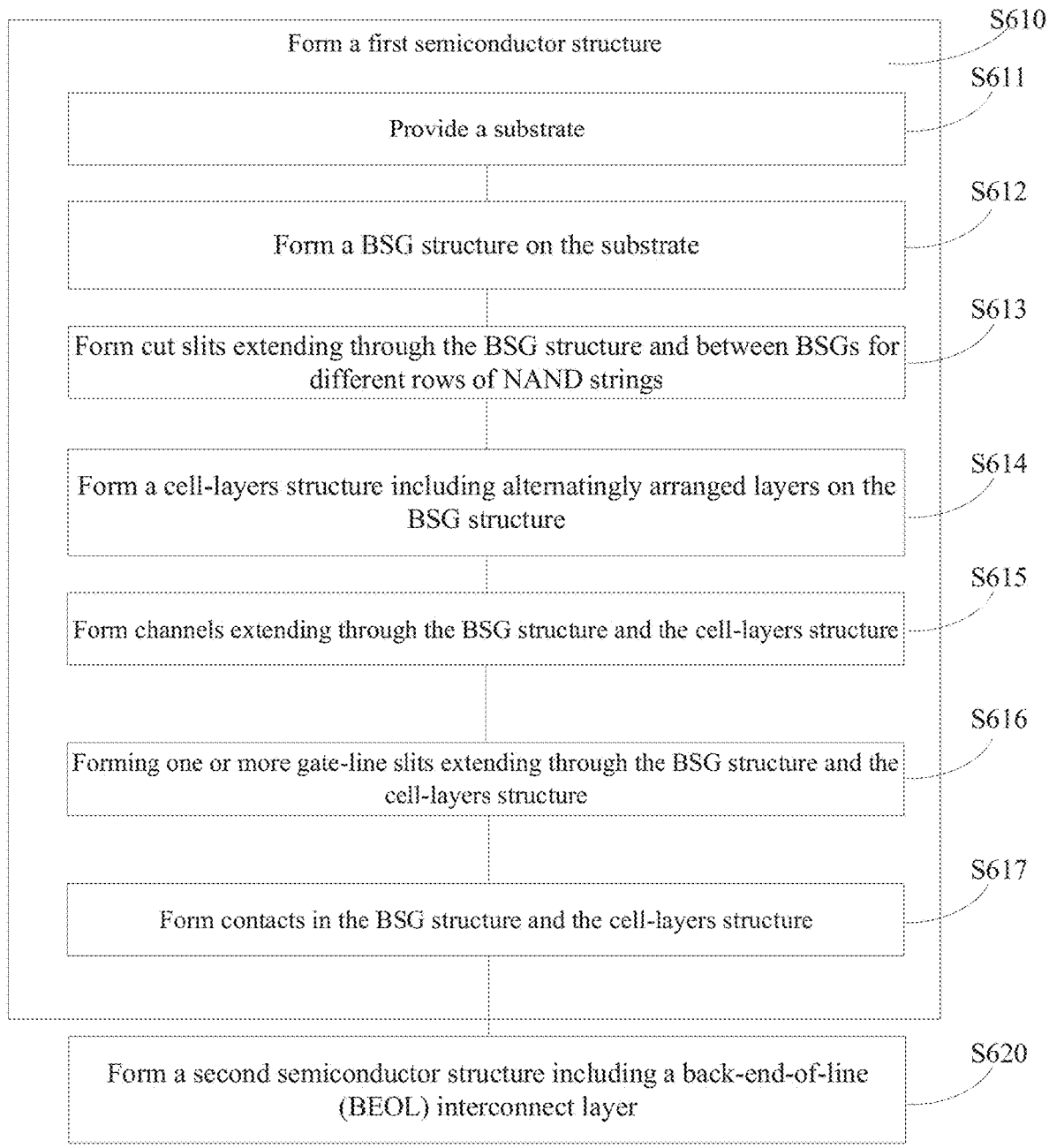
FIG. 5 illustrates a flowchart of an exemplary method for forming a 3D memory device according to various embodiments of the present disclosure.
Figure 26:
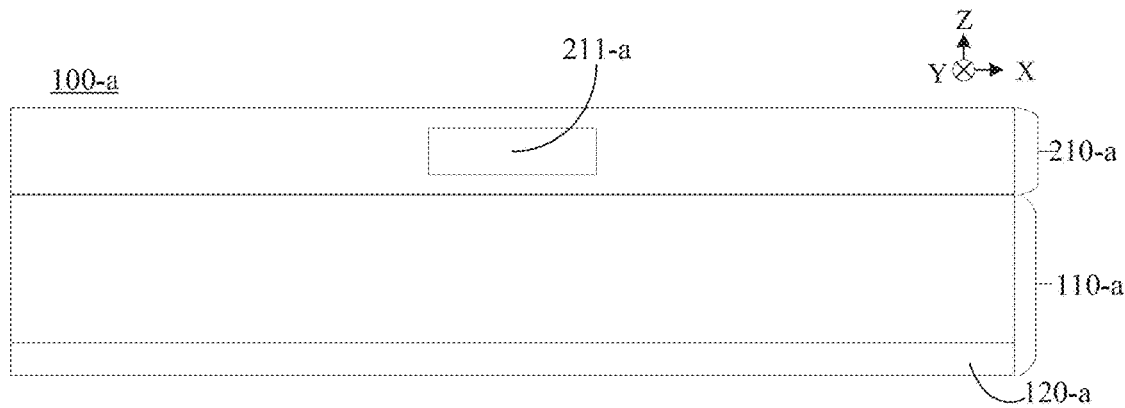
FIG. 26 illustrates another exemplary 3D memory device according to various embodiments of the present disclosure.
Figure 27:
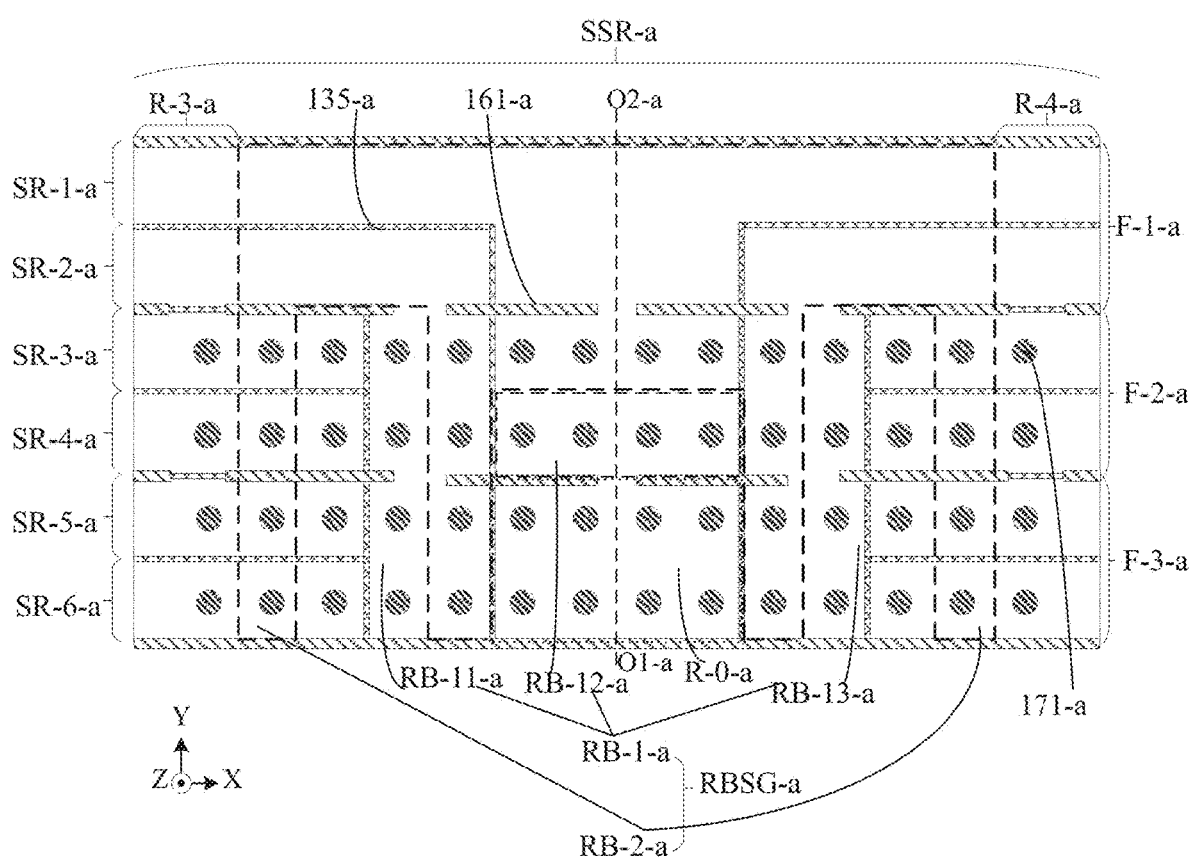
FIG. 27 illustrates another schematic view of orthogonal projections of exemplary gate-line slits, cut slits, and contacts in a staircase-structure region in a block of a 3D memory device on a substrate according to various embodiments of the present disclosure.
Figure 28:
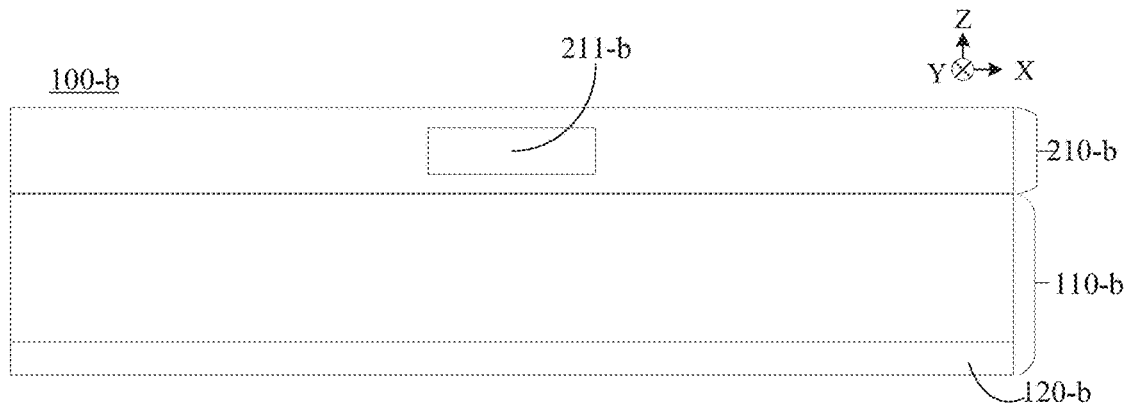
FIG. 28 illustrates another exemplary 3D memory device according to various embodiments of the present disclosure.
Figure 29:
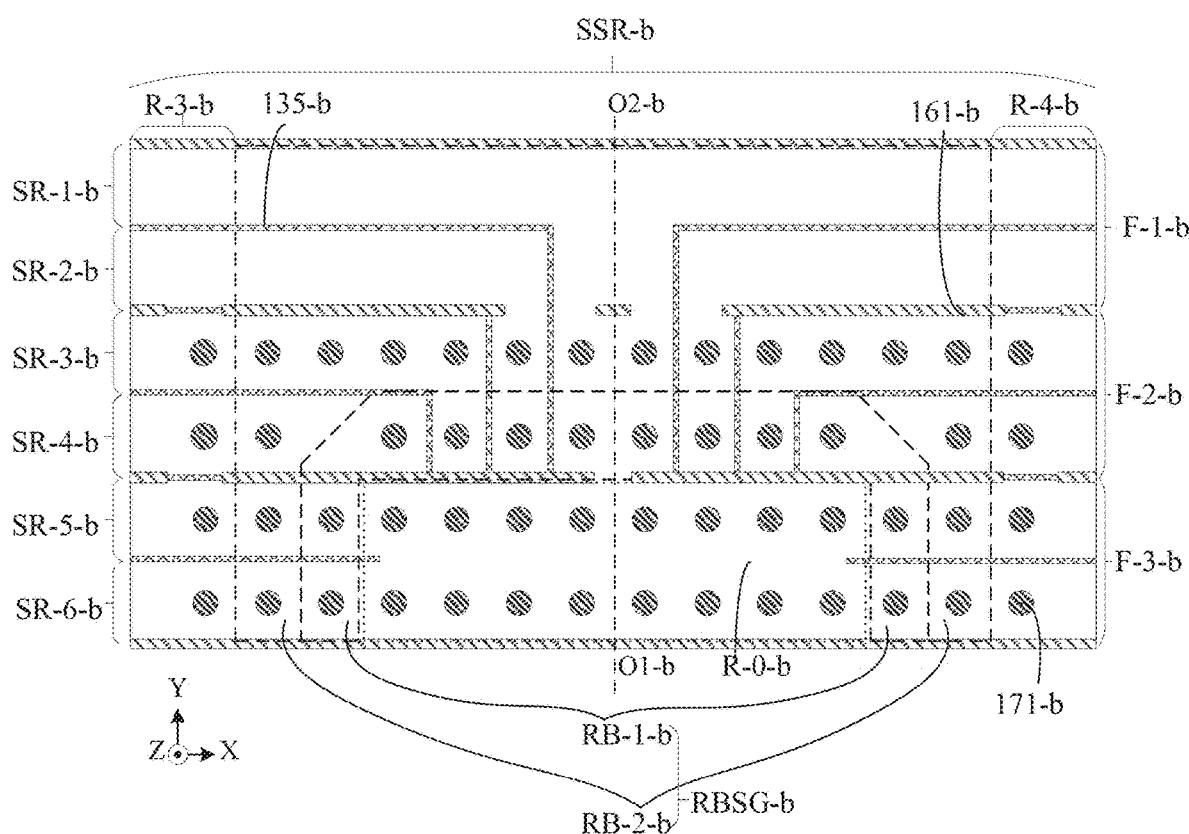
FIG. 29 illustrates another schematic view of orthogonal projections of exemplary gate-line slits, cut slits, and contacts in a staircase-structure region in a block of a 3D memory device on a substrate according to various embodiments of the present disclosure.

The present disclosure provides a three-dimensional (3D) memory device and a method for forming the three-dimensional (3D) memory device. FIG. 1 illustrates a schematic view of an exemplary three-dimensional (3D) memory device. FIG. 2 illustrates a schematic view of a first semiconductor structure of an exemplary 3D memory device. FIGS. 3 and 4 illustrate schematic views of an exemplary staircase-structure region in a block of an 3D memory device. FIG. 5 illustrates a flowchart of an exemplary method for forming a 3D memory device. FIGS. 6 to 25 illustrate schematic views of structures at certain stages of forming an exemplary 3D memory device. For example, FIGS. 6 to 16 and 18 to 24 illustrate schematic views of structures of an exemplary 3D memory device and in a staircase-structure region, and FIG. 17 illustrates a schematic view of structures in an exemplary array region. FIGS. 26 and 28 illustrate exemplary 3D memory devices. FIGS. 27 and 29 each illustrates another view of orthogonal projections of exemplary gate-line slits, cut slits, and contacts in a staircase-structure region in a block of a 3D memory device on a substrate.

FIG. 1 illustrates a schematic view of an exemplary three-dimensional (3D) memory device according to various embodiments of the present disclosure. The 3D memory device 100 includes a first semiconductor structure 110 and a second semiconductor structure 210. The first semiconductor structure 110 may include a substrate 120. A first direction in or parallel to a surface plane of the substrate is denoted as X direction. A second direction in or parallel to a surface plane of the substrate is denoted as Y direction, and a symbol near letter "Y" and showing a combination of a circle and a cross indicates that Y direction in FIG. 1 points inward with respect to the drawing sheet of the figure. A third direction that is normal to the surface plane of the substrate is denoted as Z direction.

A vertical direction with respect to the substrate may be a direction along the third direction (e.g., Z direction). A lateral or horizontal direction with respect to the substrate may be a direction (e.g., X and/or Y direction) that is parallel to the surface plane of the substrate. A lateral or horizontal plane may be a plane that is parallel to the surface plane of the substrate.

The first semiconductor structure 110 may include memory cells, word lines, contacts, channels, bottom select gates, top select gates, staircases, etc. A staircase may include one or more stairs or stairsteps. A bottom select gate can also be referred to as a "bottom-select-gate" or a "BSG." A top select gate can also be referred to as a "top-select-gate" or a "TSG." The second semiconductor device 210 may include back-end-of-line interconnect layer. In some embodiments, the second semiconductor structure 210 may be formed directly on the first semiconductor structure 110. In other embodiments, the second semiconductor structure 210 may be formed separately with respected to the first semiconductor structure 110, and further bonded with the first semiconductor structure 110.

FIG. 2 illustrates a schematic top view of a first semiconductor structure of an exemplary 3D memory device according to various embodiments of the present disclosure. For example, first semiconductor structure 110 may include one or more blocks, such as block B-1, block B-2, and so on. Block B-N indicates Nth block, where N may be a positive integer. The blocks may be arranged along Y direction and each may extend along X direction. The first semiconductor structure 110 may include a first array region, denoted as "AR-1," a second array region, denoted as "AR-2," and a staircase-structure region, denoted as "SSR," which is a central region between the first array region and the second array region in each block and includes stairs. A region in both AR-1 and B-1, i.e. a first array region in block B-1, is denoted as region (AR-1, B-1). A region in both SSR and B-1, i.e., a staircase-structure region in block B-1, is denoted as region (SSR, B-1). A region in both AR-1 and B-N, i.e. a first array region in block B-N, is denoted as region (AR-1, B-N).

FIGS. 3 and 4 illustrate schematic views of an exemplary staircase-structure region in a block of an 3D memory device according to various embodiments of the present disclosure. The staircase-structure region includes a doped well region, denoted as region "R-0"; a BSG-stair region denoted as region "RBSG," a first word-line-stair region, denoted as region "R-3"; a second word-line-stair region, denoted as region "R-4." The region RBSG may include a first BSG-stair-level region, denote as region "RB-1," and a second BSG-stair-level region, denote as region "RB-2." In some embodiments, the first BSG-stair-level region may include two sub-regions, denoted as "RB-11" and "RB-12." In some embodiments, the second BSG-stair-level region may include two sub-regions, denoted as "RB-21" and "RB-22." In some embodiments, referring to FIG. 4, the doped well region, the first BSG-stair-level region, and the second BSG-stair-level region may be arranged between the first word-line-stair region and the second word-line-stair region.

The above-described shapes and locations of the doped well region, the first BSG-stair-level region, the second BSG-stair-level region, the first word-line-stair region, and the second word-line-stair region are merely for illustrative purposes and are not intended to limit the scope of the present disclosure. Various shapes and locations of the doped well region, the first BSG-stair-level region, the second BSG-stair-level region, the first word-line-stair region, and the second word-line-stair region may be chosen according to actual application scenarios.

The doped well region, the first BSG-stair-level region, the second BSG-stair-level region, the first word-line-stair region, and the second word-line-stair region may extend in Z direction from the substrate 110 or from a position inside the substrate 110. One or more stairs for bottom select gates may be formed in the BSG-stair region; and one or more stairs for word lines and/or top select gates may be formed in the first word-line-stair region, and the second word-line-stair region. Stairs in the first BSG-stair-level region may be first-level stairs at a first height from a reference plane, e.g., a surface plane of the substrate; and stairs in the second BSG-stair-level region may be second-level stairs at a second height from the reference plane. In some embodiments, the second height may be greater than the first height.

A block of the 3D memory device may include a plurality of finger regions, such as a first finger region, a second finger region, and a third finger region, denoted as regions F-1, F-2, and F-3, respectively. Each finger region may include a plurality of string regions. For example, referring to FIG. 3, the first finger region includes two string regions SR-1 and SR-2; the second finger region includes two string regions SR-3 and SR-4; and the third finger region includes two string regions SR-5 and SR-6. Each string region may extend to the first array region and the second array region and include a row of NAND strings of the 3D memory device (not shown in FIG. 3). Each finger region may extend to the first array region and the second array region (not shown in FIG. 3).

In the present disclosure, the number of finger regions in a block may be chosen according to various application scenarios. The number of finger regions in a block may be, for example, 2, 3, 4, or any other suitable numbers. The number of string regions in a finger region may be chosen according to various application scenarios. The number of string regions in a finger region may be, for example, 1, 2, 3, 4, or any other suitable number.

FIG. 5 illustrates a flowchart of an exemplary method for forming a 3D memory device according to various embodiments of the present disclosure. Referring to FIG. 5, a first semiconductor structure is formed (S610).

For forming the first semiconductor structure, a substrate is provided (S611). Correspondingly, FIG. 6 illustrates a schematic view of a substrate of an exemplary 3D memory device according to various embodiments of the present disclosure.

Figure 6:
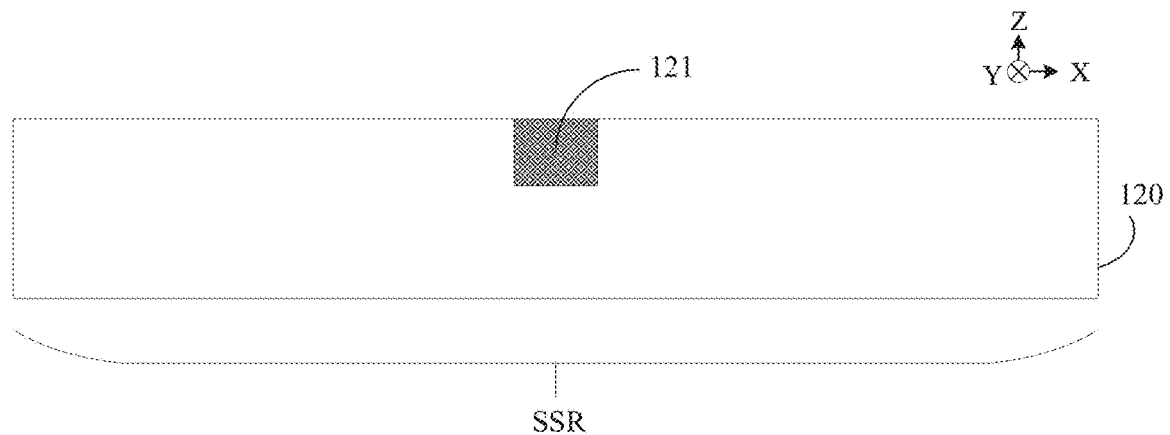
FIG. 6 illustrates a schematic view of a substrate of an exemplary 3D memory device according to various embodiments of the present disclosure.

Referring to FIG. 6, the substrate 120 includes a doped well 121. The doped well 121 may be in the doped well region R-0. The substrate 120 may include silicon, such as single-crystalline silicon, silicon germanium, gallium arsenide, germanium, or any other suitable materials. The doped well 121 may be fully or partially doped with n-type and/or p-type dopants. The doped well may be, for example, a p-well, i.e., a well that is doped with p-type dopants, or a n-well, a well that is doped with n-type dopants. For illustrative purposes, only structures in SSR are partially shown in FIG. 6. The substrate may include other regions, such as array regions AR-1 and AR-2.

Returning to FIG. 5, a BSG structure is formed on the substrate (S612). Correspondingly, FIGS. 7 to 10 illustrate schematic views of structures at certain stages of the process of forming the BSG structure.

Figure 7:
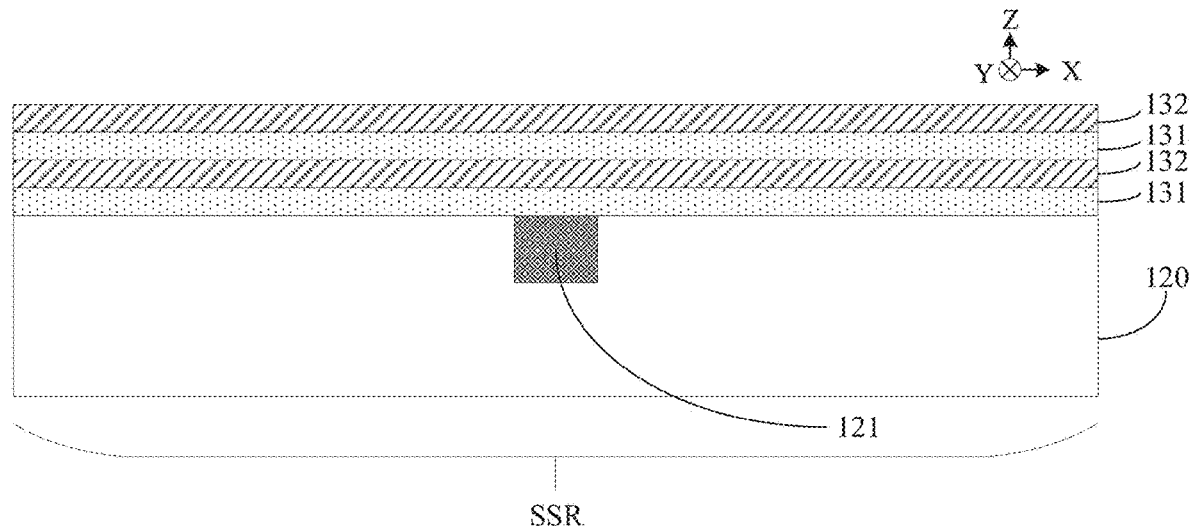
FIGS. 7 to 10 illustrate schematic views of structures at certain stages during a process of forming a bottom-select-gate structure according to various embodiments of the present disclosure.

Referring to FIG. 7, a stack structure, including alternatingly arranged sacrificial layers 132 and insulating layers 131 for the BSG structure is formed on the substrate 120. An insulating layer 131 and an adjacent sacrificial layer 132 form a tier or a pair, such as an insulating layer/sacrificial layer pair. The stack structure may include, for example, two insulating layer/sacrificial layer pairs. The pairs may be at different heights with respect to a reference surface, e.g., substrate surface of the substrate. In some embodiments, each pair may have a same thickness. In other embodiments, some pairs may have different thicknesses.

The above-described two insulating layer/sacrificial layer pairs in the stack structure are merely for illustrative purposes and are not intended to limit the scope of the present disclosure. The number of pairs may be chosen according to various application scenarios. The number of pairs may be, for example, 1, 2, 3, 4, or any other suitable numbers.

In some embodiments, the sacrificial layer may include, for example, poly-silicon, poly-germanium, and/or silicon nitride. In some embodiments, the insulating material may include, for example, an oxide material, such as silicon oxide.

In some embodiments, the sacrificial layer may include any suitable material different from the insulating layer. For example, the sacrificial layer may be nitride, the insulating layer may be oxide, and the sacrificial layer/insulating layer pair may be a nitride-oxide pair.

In some embodiments, the stack structure may include one or more sacrificial layer/insulating layer pairs, and further may include a bottom insulating layer and/or a top insulating layer. For example, the stack structure may include a bottom insulating layer and one or more sacrificial layer/insulating layer pairs, and the bottom insulating layer is in contact with a sacrificial layer of an adjacent pair. In some embodiments, in a sacrificial layer/insulating layer pair, the sacrificial layer may be above the insulating pair. In other embodiments, in a sacrificial layer/insulating layer pair, the insulating pair may be above the sacrificial layer.

Figure 8:
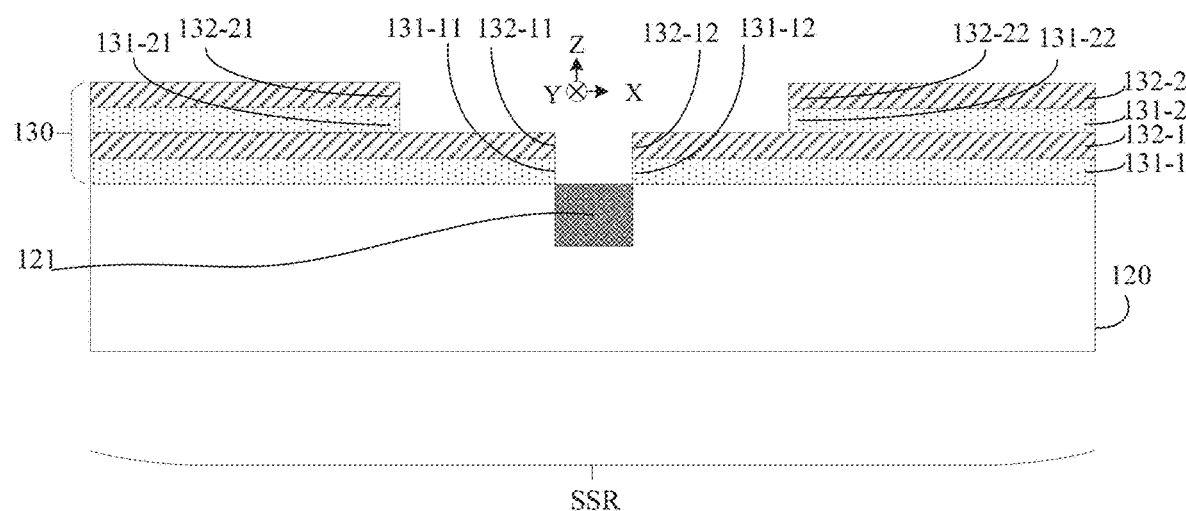
Figure 9:
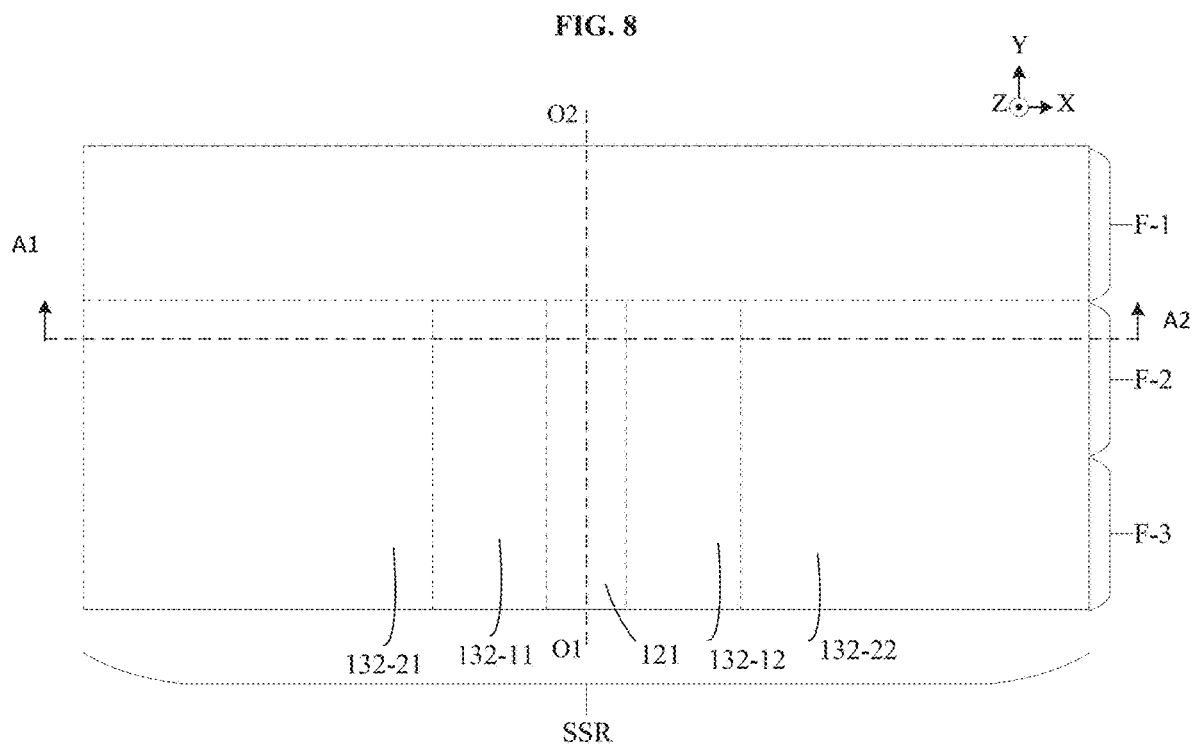

FIGS. 8 and 9 illustrate exemplary BSG stairs formed in an exemplary BSG structure. FIG. 9 is a top view, and FIG. 8 is a cross-sectional view along direction A1-A2 in FIG. 8.

Referring to FIGS. 8 and 9, a BSG structure 130 may include, for example, a first BSG structure and a second BSG structure formed on the staircase-structure region (SSR) of the substrate 120 and on opposite sides of the doped well 121. In some embodiments, a top of the first BSG structure and a top of the second BSG structure may have a same height or different heights from the substrate 120.

Stairs are formed in the BSG structure 130, the 131-1/132-1 pair forms stairs or stairsteps, at a first height; and the 131-2/132-2 pair forms stairs at a second height. The 131-1/132-1 stairs and the 131-2/132-2 stairs are at different heights. A height of a stair may be a distance along Z direction from a reference plane to a surface of the stair. The surface of the stair may be, for example, a top surface of the stair or a top surface of a layer of the stair. The reference plane may be, for example, a surface plane of the substrate.

In some embodiments, stairs in the BSG structure may be formed on two sides of a central plane O1-O2 of the staircase-structure region. A central plane may be, for example, a plane at a central location of the staircase-structure region in a first direction and parallel to a second direction and a third direction. The 131-11/132-11 stair and the 131-21/132-21 stair may be on one side of the central plane O1-O2, and the 131-12/132-12 stair and the 131-22/132-22 stair may be on another side of the central plane O1-O2. The above-described shapes and locations of the stairs are merely for illustrative purposes and are not intended to limit the scope of the present disclosure. Various shapes and locations of the stairs in the BSG structure may be chosen according to actual needs.

The 131-11/132-11 stair and the 131-21/132-21 stair may be at different locations with respected to each other. The 131-11/132-11 stair may be in the first BSG-stair-level region and at a first height; and the 131-21/132-21 stair may be in the second BSG-stair-level region and at a second height.

In some embodiments, stairs in the first BSG-stair-level region may be at a first height; stairs in the second BSG-stair-level region may be at a second height.

In some embodiments, the BSG stairs may be formed by etching to remove portions of alternatingly arranged sacrificial layers and insulating layers, such as dry etch or wet etch.

Figure 10:
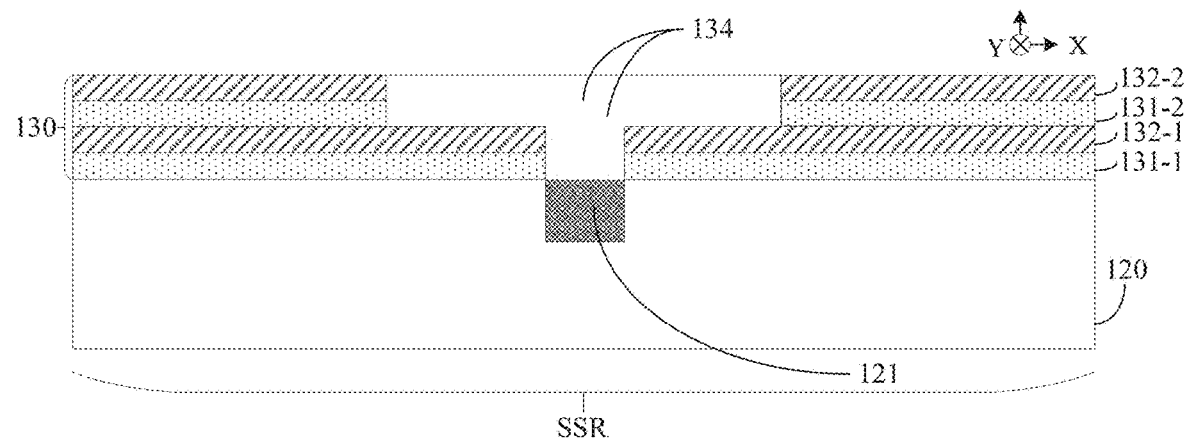

Referring to FIG. 10, insulating layers 134 are formed in the BSG structure 130. The insulating layer may include, for example, oxide. The insulating layers 134 may be formed by depositing insulating materials in empty regions in the BSG structure 130, e.g., regions between the stairs of the BSG structure 130 via a deposition process, such as a chemical vapor deposition (CVD) process, a physical vapor deposition (PVD) process, and/or an atomic layer deposition (ALD) process; and removing excess insulating materials via a planarization process, such as a chemical-mechanical-planarization (CMP).

Returning to FIG. 5, cut slits, i.e., BSG cut slits, extending through the BSG structure and between BSGs for different rows of NAND strings are formed (S613). Correspondingly, FIG. 11 illustrates structures at certain stage(s) of the process of forming the cut slits according to various embodiments of the present disclosure.

Figure 11:
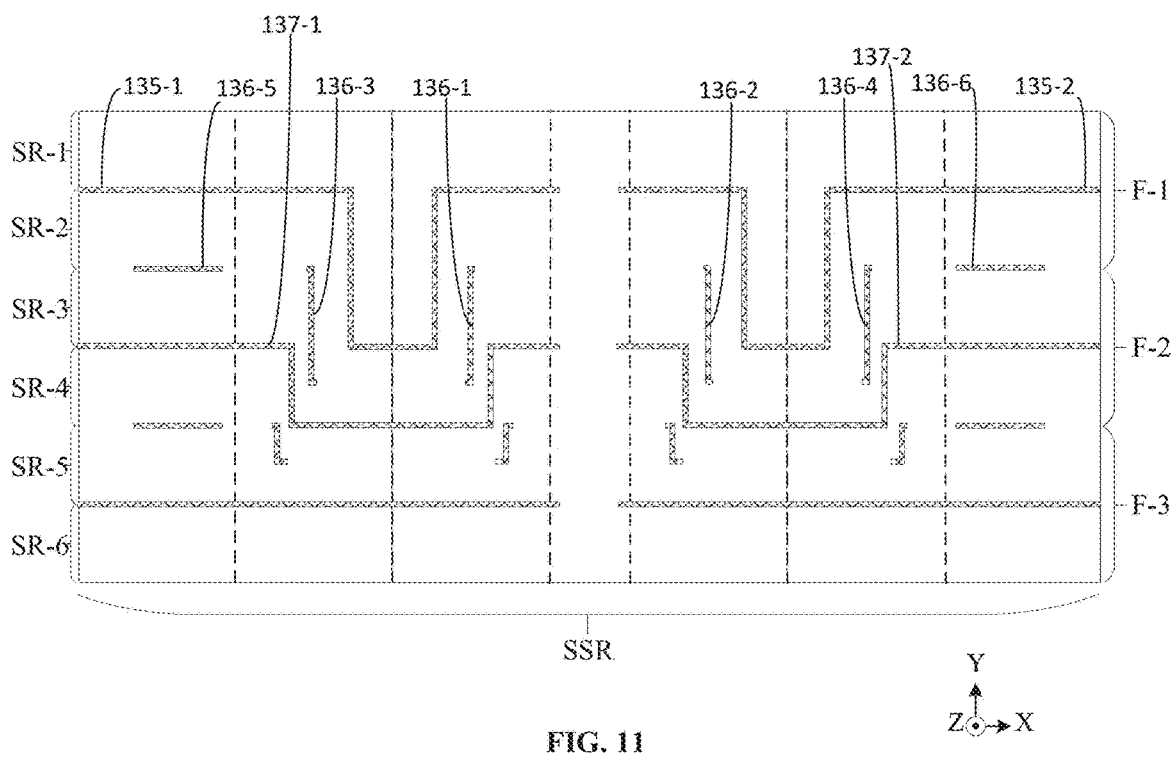
FIG. 11 illustrates structures at certain stage(s) during a process of forming cut slits according to various embodiments of the present disclosure.

Referring to FIG. 11, a plurality of cut slits are formed in the first semiconductor structure, such as cut slits 135-1, 135-2, 136-1, 136-2, 136-3, 136-4, 136-5, 136-6, 137-1, and 137-2. In some embodiments, cut slits may extend through the BSG structure vertically, i.e., in the third direction, and be between BSGs for different rows of NAND strings. That is, the plurality of cut slits may extend vertically through the plurality of bottom select gates to electrically separate portions of the plurality of bottom select gates and to form separated bottom select gates. In some embodiments, cut slits may extend from one finger region to another finger region, e.g., horizontally in X-Y plane. For example, cut slit 135-1 may extend from the first finger region to the second finger region.

In some embodiments, the cut slits for the BSG structure 130 may extend from a top of the BSG structure 130 to a portion of the substrate 120. In some embodiments, the cut slits of the BSG structure 130 may be formed by forming trenches in the BSG structure and the substrate, followed by filling the trenches with an insulating material via a deposition process. The trenches may be formed, for example, by forming a mask layer over the BSG structure; patterning the mask layer by using photolithography to form openings corresponding to the trenches, and removing portions of the BSG structure and the substrate exposed by the openings until the trenches reach a preset depth in the substrate. The deposition process may include, for example, CVD, PVD, and/or ALD. The insulating material can include silicon oxide, silicon nitride, silicon oxynitride, and/or any other suitable insulating materials. In some embodiments, a chemical-mechanical planarization (CMP) may be used to remove excessive insulating material after the deposition.

Returning to FIG. 5, a cell-layers structure including alternatingly arranged layers is formed on the BSG structure (S614). Correspondingly, FIGS. 12 to 17 illustrate structures at certain stages of the process of forming the cell-layers structure.

Figure 12:
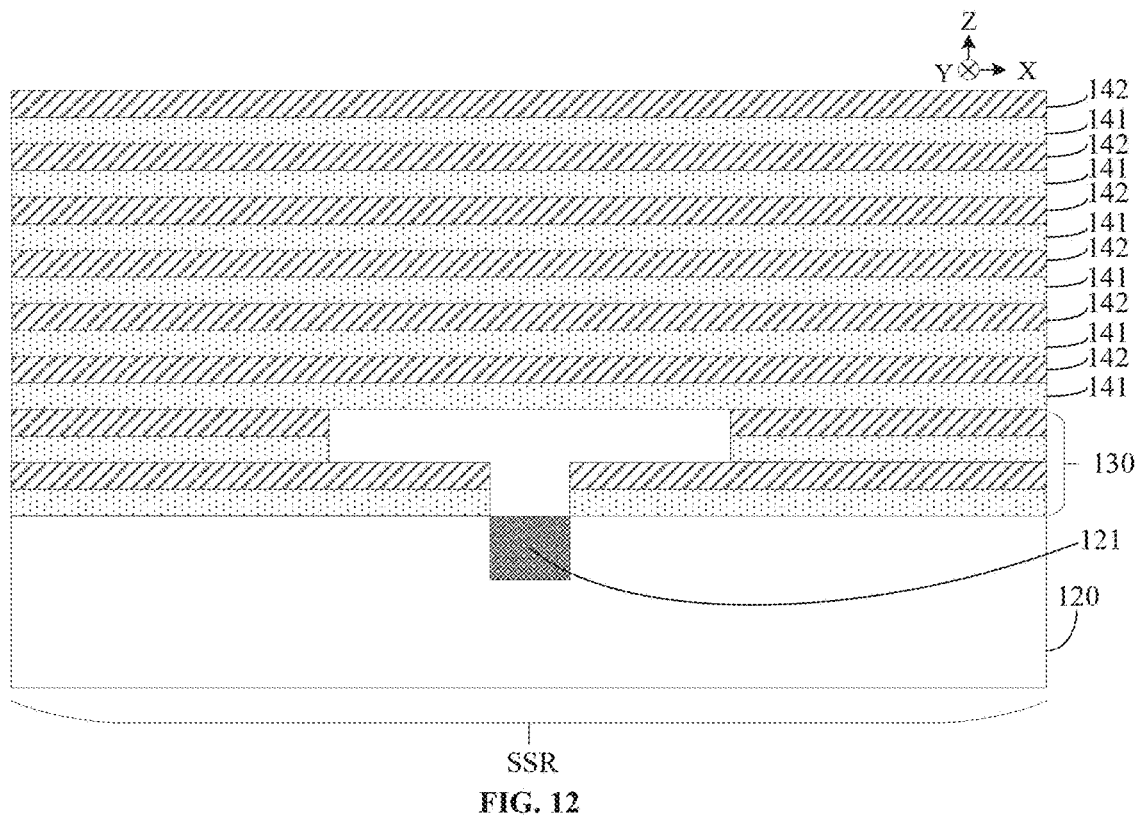
FIGS. 12 to 17 illustrate structures at certain stages during a process of forming a cell-layers structure according to various embodiments of the present disclosure.
Figure 13:
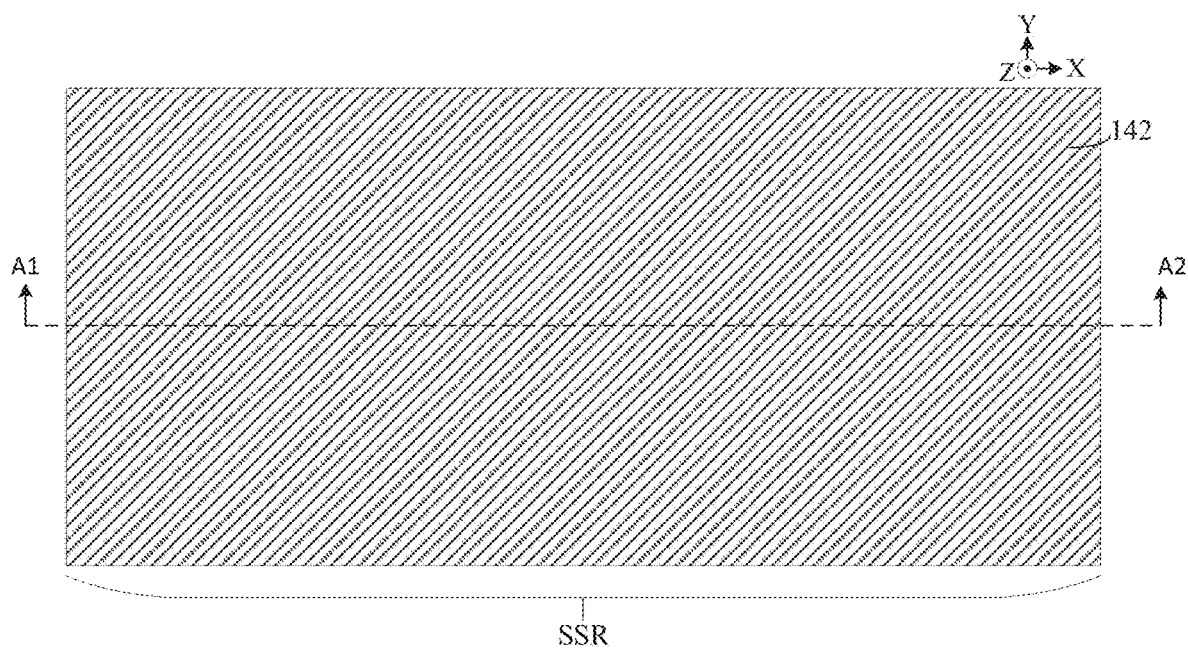

FIGS. 12 to 13 illustrate an exemplary stack structure including alternatingly arranged sacrificial layers and insulating layers for a cell-layers structure on a BSG structure. FIG. 13 is a top view, and FIG. 12 is a cross-sectional view along direction A1-A2 in FIG. 13.

Referring to FIGS. 12 and 13, a stack structure including alternatingly arranged sacrificial layers 142 and insulating layers 141 for the cell-layers structure is deposited on the BSG structure 130. An insulating layer and an adjacent sacrificial layer may form a tier or a pair. The stack structure may include, for example, six sacrificial layer/insulating layer pairs. In some embodiments, the sacrificial layer may include, for example, poly-silicon, poly-germanium, and/or silicon nitride. In some embodiments, the insulating material may include, for example, an oxide material, such as silicon oxide.

The above described six pairs in the stack structure are merely for illustrative purposes and are not intended to limit the scope of the present disclosure. The number of pairs may be chosen according to various application scenarios. The number of pairs may be, for example, a positive integer. The number of pairs may be, for example, 6, 16, 18, 32, 34, 64, 66, 132, 134 or any other suitable numbers, such as a suitable positive integer.

In some embodiments, the stack structure may include one or more sacrificial layer/insulating layer pairs, and further may include a bottom insulating layer and/or a top insulating layer. For example, the stack structure may include a bottom insulating layer and one or more sacrificial layer/insulating layer pairs, and the bottom insulating layer is in contact with a sacrificial layer of an adjacent pair. In some embodiments, in a sacrificial layer/insulating layer pair, the sacrificial layer may be above the insulating pair. In other embodiments, in a sacrificial layer/insulating layer pair, the insulating pair may be above the sacrificial layer.

Figure 14:
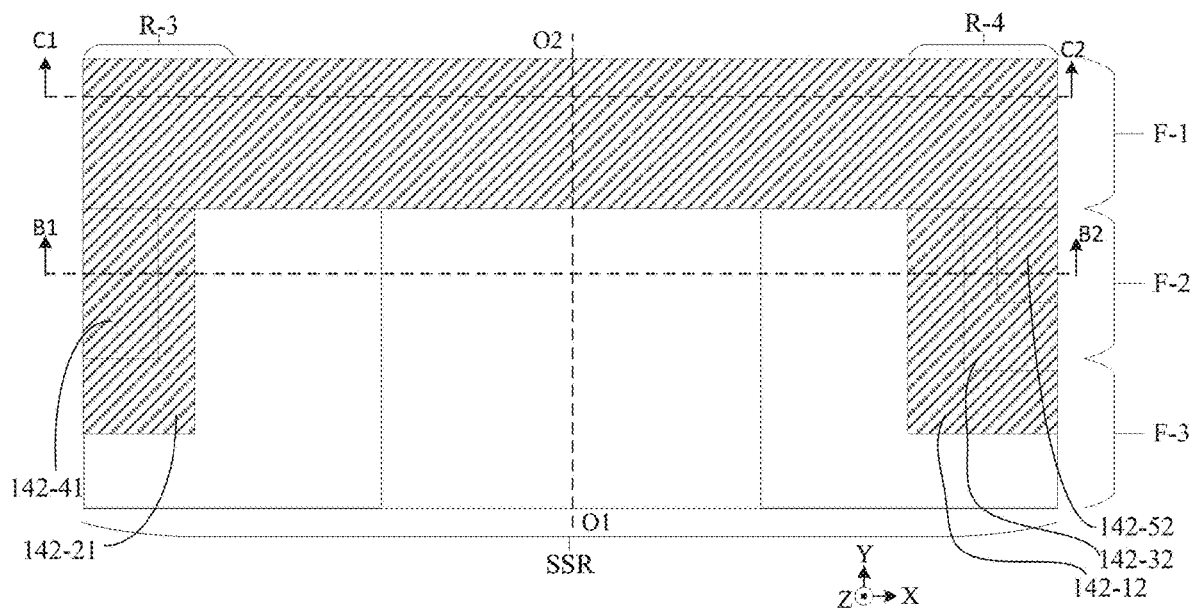
Figure 15:
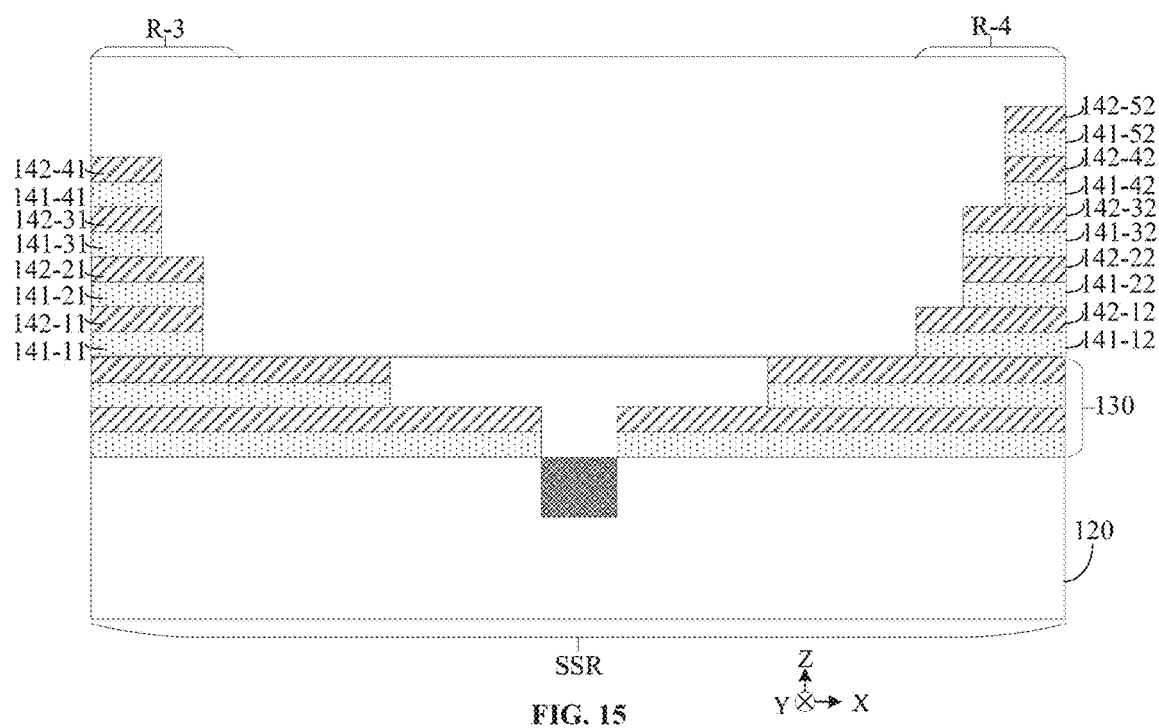
Figure 16:
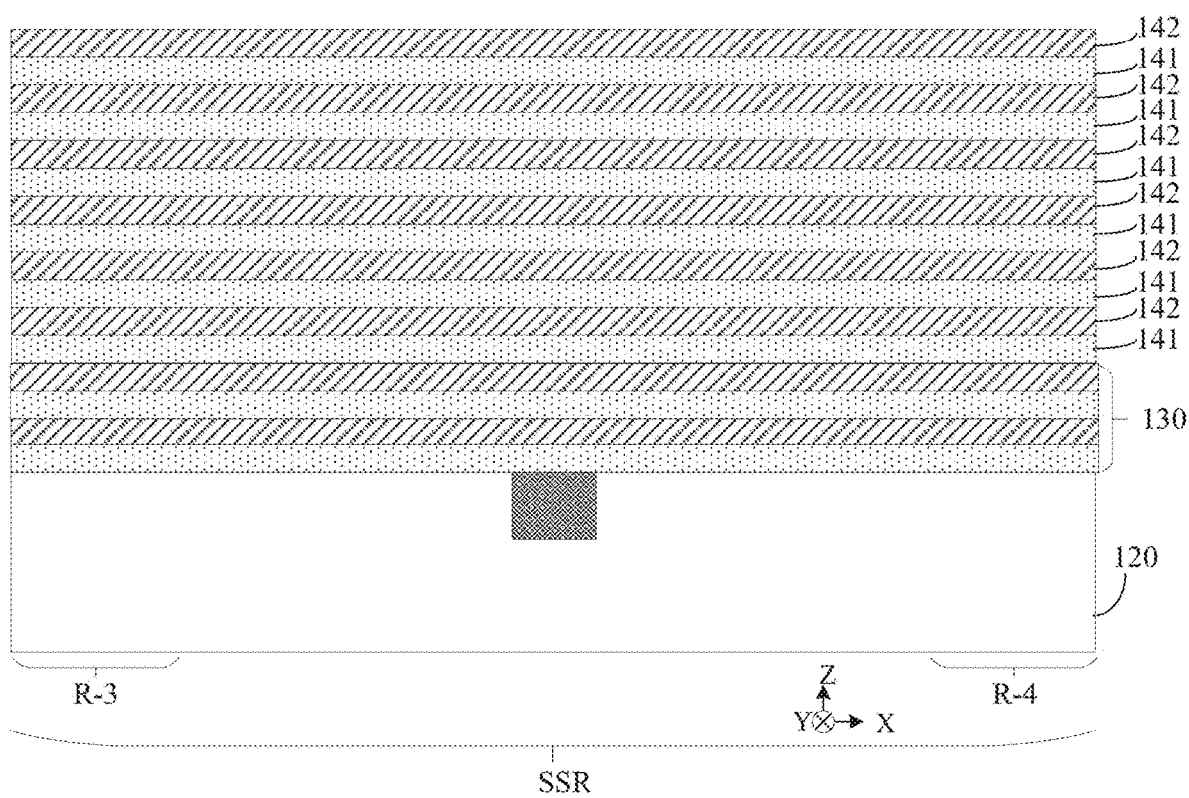
Figure 17:
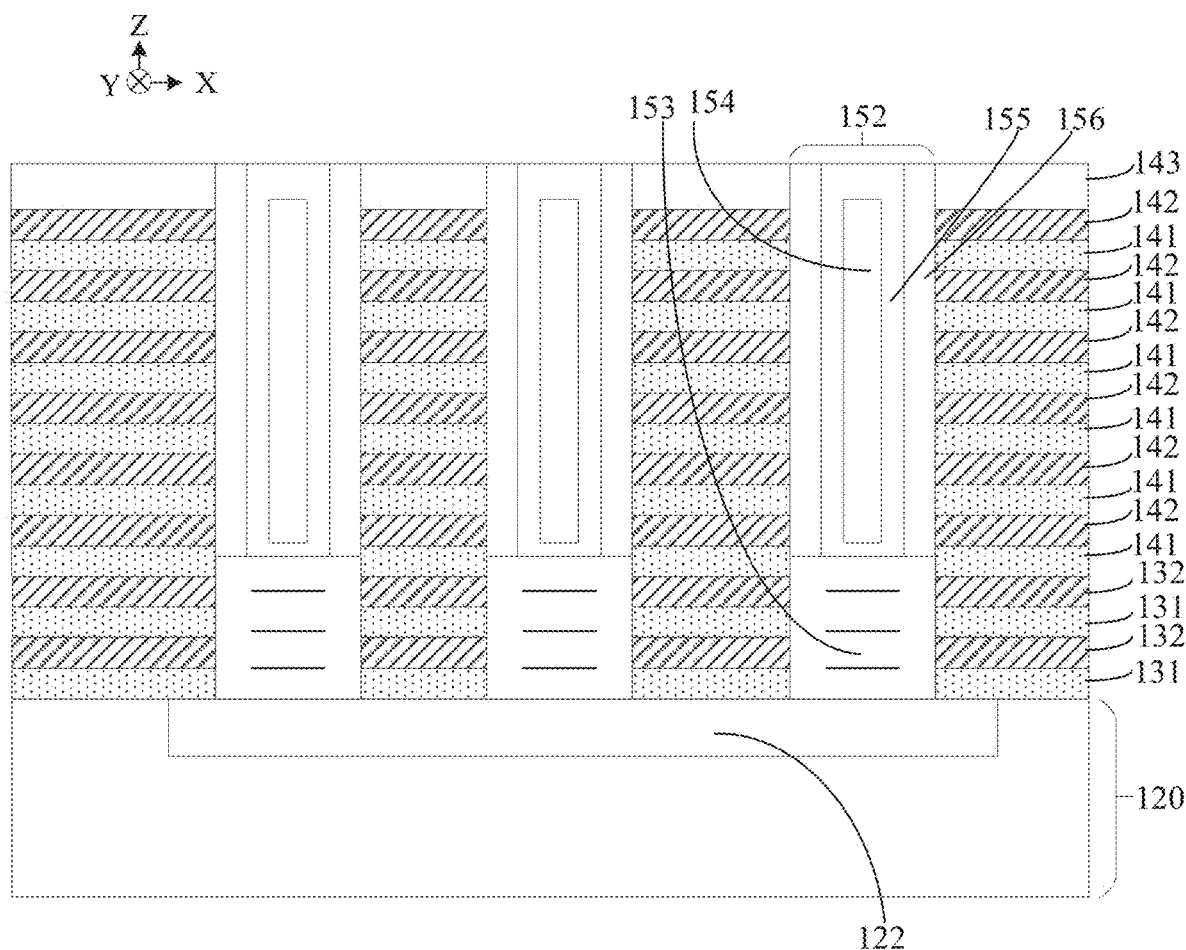

FIGS. 14 to 16 illustrate exemplary stairs formed in the cell-layers structure according to various embodiments of the present disclosure. FIG. 14 illustrates a top view of the exemplary cell-layers structure including stairs in SSR. FIG. 15 illustrates a cross-sectional view along direction B1-B2 in FIG. 14. FIG. 16 is a cross-sectional view along direction C1-C2 in FIG. 14. C1-C2 is in the wall region, i.e., region F-1, of the first semiconductor structure 110.

Referring to FIGS. 14, 15, and 16, portions of the sacrificial layer/insulating layer pairs of the cell-layers structure in regions F-2 and F-3 are removed to form layer pairs 141-12/142-12, 141-22/142-22, 141-32/142-32, 141-42/142-42, and 141-52/142-52 in region R-4 of the second and third finger regions, and layer pairs 141-11/142-11, 141-21/142-21, 141-31/142-31, and 141-41/142-41 in region R-3 of the second and third finger regions. Referring to FIG. 16, in region F-1, the sacrificial layer 142/insulating layer 141 pairs of the cell-layers structure in region R-3 are connected to the sacrificial layer 142/insulating layer 141 pairs of the cell-layers structure in region R-4. That is, in region F-1, the sacrificial layer/insulating layer pairs of the cell-layers structure in region R-3 extend to the sacrificial layer/insulating layer pairs of the cell-layers structure in region R-4. Accordingly, the sacrificial layer/insulating layer pairs of the cell-layers structure in the first array region, i.e., region AR-1, are connected with the sacrificial layer/insulating layer pairs of the cell-layers structure in the second array region, i.e., region AR-2 (not shown in FIG. 16). Region F-1 may be a wall region, and in the wall region, layers of the cell-layers structure in region R-3 of the region F-1 may extend to the layers of the cell-layers structure in region R-4 of the region F-1.

In some embodiments, layer pairs 141-12/142-12, 141-32/142-32, and 141-52/142-52 may form stairs; and layer pairs 141-21/142-21 and 141-41/142-41 may form stairs. With the above-described connections in region F-1, regions R-3 and R-4 may share stairs. For example, layer pair 141-12/142-12 may serve as a stair for itself and for layer pair 141-11/142-11; layer pair 141-32/142-32 may serve as a stair for itself and for layer pair 141-31/142-31; layer pair 141-21/142-21 may serve as a stair for itself and for layer pair 141-22/142-22; and layer pair 141-41/142-41 may serve as a stair for itself and for layer pair 141-42/142-42. The sharing of the stairs may reduce the number of stairs and, thus, reduce lengths of the staircase. In other embodiments, layer pairs on one side of central plane O1-O2 may each form a stair and layer pairs on another side of central plane O1-O2 may each form a stair.

In some embodiments, the stairs in the cell-layers structure may include stairs for word lines. In some embodiments, the stairs in the cell-layers structure may include stairs for word lines and/or stairs for one or more top select gates. In some embodiments, the stairs in the cell-layers structure may include stairs for word lines, and stairs for one or more top select gates may be further formed over the stairs for word lines.

Forming the cell-layers structure (S614) may further include forming one or more insulating layers. The insulating layers may be formed over the alternatingly arranged sacrificial layers and insulating layers of the cell-layers structure; and space between the stairs of the cell. The insulating layer may include, for example, oxide. The insulating layers may be formed by depositing insulating materials via a deposition process, such as a chemical vapor deposition (CVD) process, a physical vapor deposition (PVD) process, and/or an atomic layer deposition (ALD) process; and removing excess insulating materials via a planarization process, such as a chemical-mechanical-planarization (CMP).

The cell-layers structure may include stairs in SSR, and may further include NAND strings in the array regions. FIG. 17 illustrate a schematic view of a portion of an exemplary array region according to various embodiments of the present disclosure. The portion of the array region includes a plurality of NAND strings 152. The array region may be, for example, the first array region or the second array region.

The plurality of NAND strings 152 may be formed on a doped region 122 of the substrate 120, and may extend through alternatingly arranged sacrificial layers 142 and insulating layers 141 and an insulating layer 143. The NAND string 152 may include an epitaxial layer 153, a semiconductor channel 155, and a dielectric layer 156, and an insulating layer 154. The epitaxial layer 153 may be at the lower end of the NAND string 152 and may be in contact with both the semiconductor channel 155 and a doped region 122 of substrate 120. The epitaxial layer 153 may serve as a channel controlled by a select gate at the lower end of the NAND string, such as a bottom select gate. In some embodiments, the semiconductor channel 155 may include silicon, such as amorphous silicon, polysilicon, and/or single crystalline silicon. In some embodiments, the dielectric layer 156 may include a tunneling layer, a storage layer, and a blocking layer. The NAND string 152 may have a cylinder shape. In some embodiments, the tunneling layer, the storage layer, and the blocking layer may be arranged in such order from a center toward the outer surface of the cylinder. For example, the tunneling layer may be close to the semiconductor channel 155; the storage layer is farther from the semiconductor channel 155 than the tunneling layer is; and the blocking layer is farther from the semiconductor channel 155 than the storage layer is. The NAND string 152 may be in contact with alternatingly arranged sacrificial layers 142 and insulating layers 141, and alternatingly arranged sacrificial layers 132 and insulating layers 131.

Returning to FIG. 5, channels extending through the BSG structure and the cell-layers structure are formed (S615). Correspondingly, FIGS. 18 to 19 show structures at certain stages of the process of forming the channels.

Figure 18:
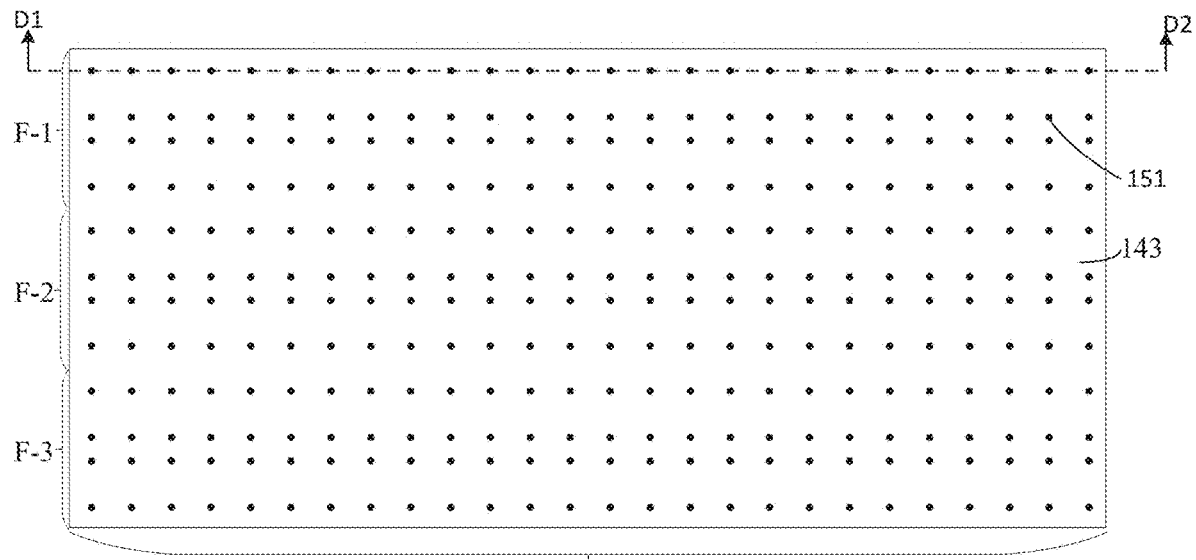
FIGS. 18 to 19 show structures at certain stages during a process of forming channels according to various embodiments of the present disclosure.

FIG. 18 illustrates a top view. FIG. 19 is a cross-sectional view along direction D1-D2 in FIG. 18.

Figure 19:
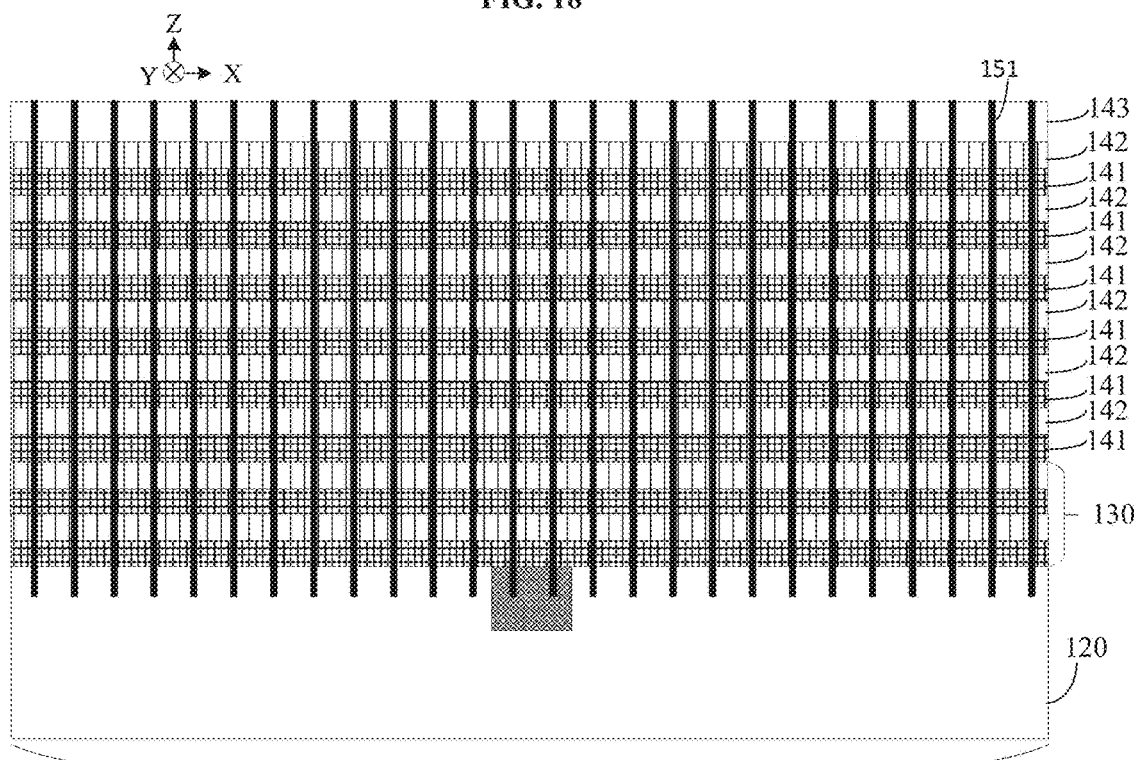

Referring to FIGS. 18 and 19, a plurality of channels 151 are formed in the 3-D memory device. The plurality of channels 151 may extend through the BSG structure and the cell-layers structure from a top portion of the cell-layers structure to a portion of the substrate 120 along the Z direction. For example, the plurality of channels 151 may extend vertically from an insulating layer 143 at a top portion of the cell-layers structure to a portion of the substrate 120. In some embodiments, the plurality of channels may include, for example, dummy channels, such as dummy channels in the region SSR. The dummy channels may support the stack structure during removal of sacrificial layers.

In some embodiments, an insulating layer may be further formed on the cell-layers structure. For details about forming insulating layer, references can be made to the above descriptions.

Figure 20:
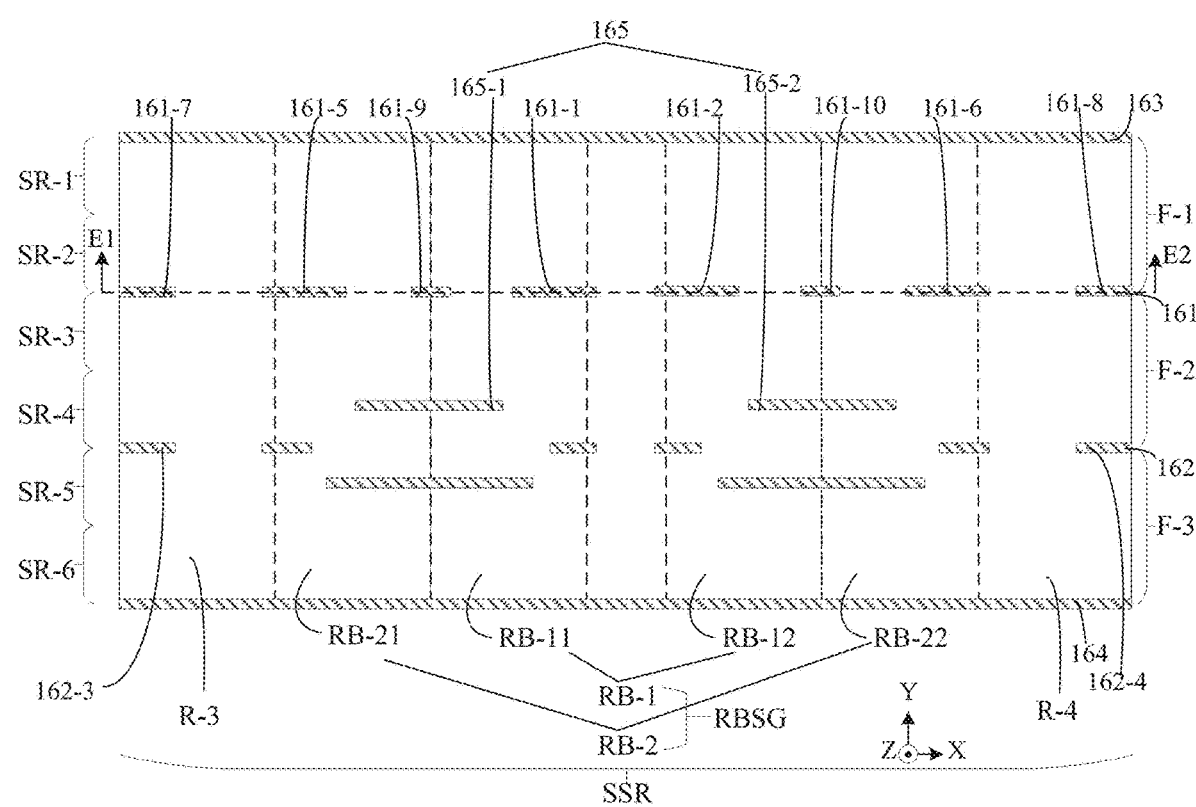
FIGS. 20 and 21 illustrate structures at certain stages during a process of forming one or more gate-line slits according to various embodiments of the present disclosure.
Figure 21:
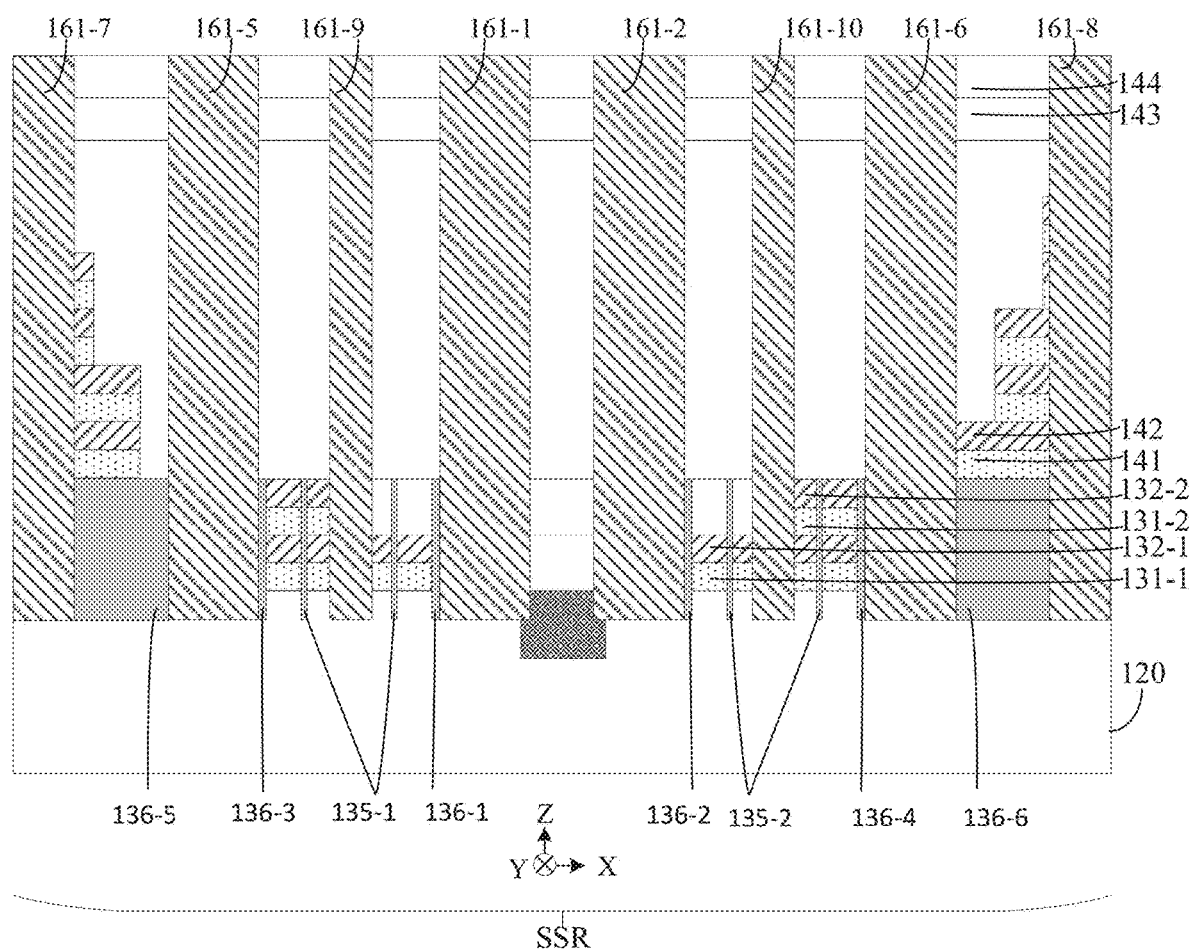

Returning to FIG. 5, one or more gate-line slits extending through the BSG structure and the cell-layers structure are formed (S616). FIGS. 20 and 21 illustrate structures at certain stages of the process of forming the one or more gate-line slits. FIG. 20 is a top view and FIG. 21 is a cross-sectional view along direction E1-E2 in FIG. 20.

Referring to FIGS. 20 and 21, a plurality of gate-line slits are formed, such as gate-line slit 161 that includes gate-line sub-slits 161-1, 161-2, 161-5, 161-6, 161-7, 161-8, 161-9, and 161-10, gate-line slits 162, 163, and 164, and gate-line slit 165 that includes gate-line sub-slits 165-1 and 165-2. In some embodiments, each gate-line slit and each gate-line sub-slit may extend vertically through the cell-layers structure and BSG structure and extending into a portion of the substrate 120. For example, the plurality of gate-line slits may extend along −Z direction from an insulating layer 144 into the substrate 120. Between gate-line slits or between gate-line sub-slits, there may be inter portions. For example, there is an inter portion between gate-line sub-slits 161-5 and 161-7.

In some embodiments, a plurality of gate-line slits may extend vertically through the cell-layers structure and the BSG structure, and may extend into a portion of the substrate, and may distinguish, e.g., separate, a plurality of finger regions of the three-dimensional memory device. In some embodiments, certain gate-line slits may extend into the first array region and/or the second array region.

In some embodiments, a plurality of cut slits may distinguish a plurality of string regions in at least one of the plurality of finger regions, and each string region may include or may correspond to a row of NAND strings, and a NAND string may include a plurality of NADN memory cells combined in a string in the first array region and the second array region (not shown in FIG. 20).

In some embodiments, gate-line sub-slits 161-7 and 161-8 may be between the first and second finger regions and may extend to the first array region and the second array region along the first direction, respectively. Accordingly, gate-line slit 161 which includes gate-line sub-slits 161-7 and 161-8 may extend to the first array region and the second array region along the first direction. Gate-line sub-slits 162-3 and 162-4 may be between the second and third finger regions and may extend to the first array region and the second array region along the first direction, respectively. Accordingly, gate-line slit 162 which includes gate-line sub-slits 162-3 and 162-4 may extend to the first array region and the second array region along the first direction.

If alternatingly arranged sacrificial layers and insulating layers of the cell-layers structure exist on both the first finger region and the second finger region and adjacent to an inter portion, the alternatingly arranged sacrificial layers and insulating layers of the cell-layers structure in the first finger region may be connected to the alternatingly arranged sacrificial layers and insulating layers of the cell-layers structure in the second finger region via the inter portion.

In some embodiments, cut slits may extend vertically from a top of the BSG structure 130 to a portion of the substrate 120. That is, cut slits may extend vertically from a top of the BSG structure 130 to a depth into the substrate 120. For example, referring to FIG. 21, cut slits 136-1, 136-2, 136-3, 136-4, 136-5, 136-6, 135-1, and 135-2 extend from a top of the BSG structure 130 to a portion of the substrate 120.

Figure 22:
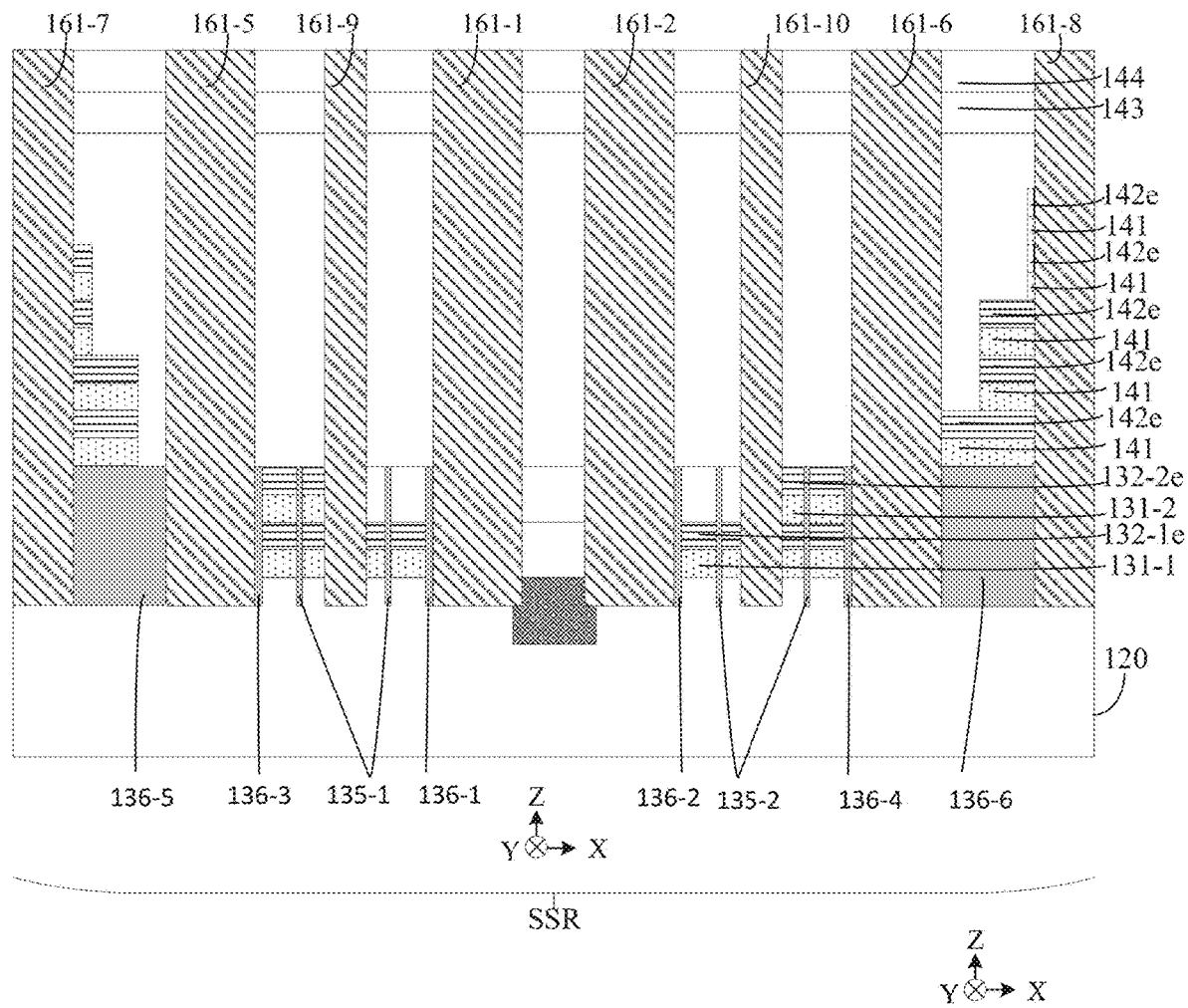
FIG. 22 illustrates a cross-sectional view along direction E1-E2 in FIG. 20 after sacrificial layers in a 3D memory device are removed and a plurality of electrodes are formed according to various embodiments of the present disclosure.

In some embodiments, sacrificial layers in the BSG structure and sacrificial layers in the cell-layers structure may be removed to form horizontal trenches between insulating layers in the BSG structure and horizontal trenches between insulating layers in the cell-layers structure. Further, a plurality of electrodes may be formed in horizontal trenches. The plurality of electrodes may include a plurality of word lines, and bottom select gates. In some embodiments, the plurality of electrodes may further include, for example, one or more top select gates. FIG. 22 illustrates a cross-sectional view along direction E1-E2 in FIG. 20 after sacrificial layers in a 3D memory device are removed and a plurality of electrodes are formed.

Referring to FIGS. 20 and 22, the gate-line slit 161 including the gate-line sub-slits 161-7 and 161-8 may be between regions F-1 and F-2, so as to distinguish regions F-1 and F-2, e.g., to separate region F-1 from region F-2. For electrodes such as 142e and insulating layers such as 141 of the cell-layers structure existing in both region F-1 and the region F-2, adjacent to an inter portion between gate-line slits or between gate-line sub-slits, and at same heights with respect to a substrate surface, the electrodes and insulating layers of the cell-layers structure in the first finger region may be connected to the electrodes and insulating layers of the cell-layers structure in the second finger region at the inter portion. Accordingly, the electrodes of the cell-layers structure in the first finger region may be electrically connected to the electrodes of the cell-layers structure in the second finger region at the inter portion.

In some embodiments, the electrodes such as 142e of the cell-layers structure may include, for example, one or more word lines. In some embodiments, the electrodes such as 142e of the cell-layers structure may include, for example, one or more word lines and/or one or more top select gates.

In some embodiments, word lines in the first finger region may be connected to, e.g., electrically connected to, word lines in the second finger region at an inter portion between gate-line slits or between gate-line sub-slits.

For example, electrode 142e/insulating layer 141 pairs in the first finger region may be connected to electrode 142e/insulating layer 141 pairs in the second finger region at an inter portion between gate-line slits or between gate-line sub-slits. Word lines in the first finger region may be connected to, e.g., electrically connected to, word lines in the second finger region at the inter portion.

One or more electrode/insulating layer pairs in the BSG structure 130 may include, for example, an electrode 132-1e/insulating layer 131-1 pair and/or an electrode 132-2e/insulating layer 131-2 pair.

Figure 23:
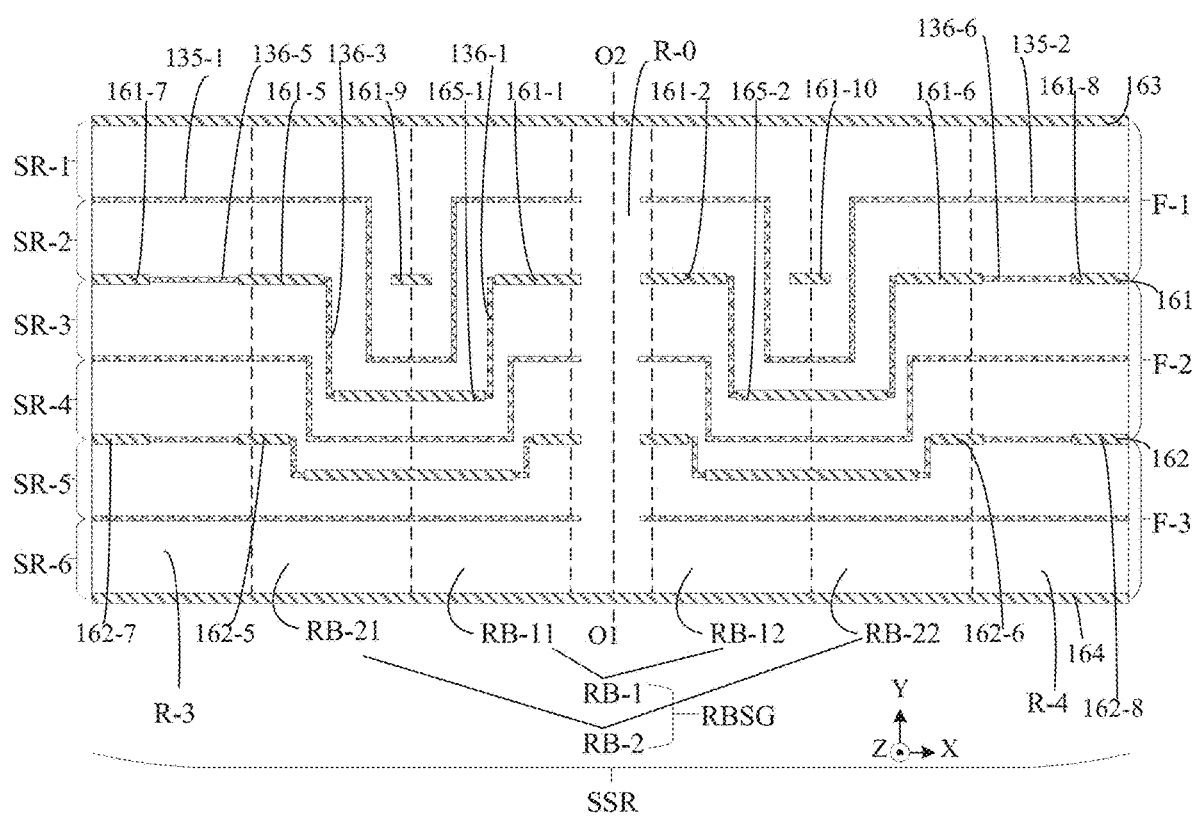
FIG. 23 illustrates a schematic view of orthogonal projections of exemplary gate-line slits and cut slits on the substrate according to various embodiments of the present disclosure.

FIG. 23 illustrates a schematic view of orthogonal projections of exemplary gate-line slits and cut slits on the substrate according to various embodiments of the present disclosure.

Referring to FIG. 23, orthogonal projections of gate-line slits and gate-line sub-slits, such as gate-line sub-slit 161-1, and cut slits, such as cut slit 135-1, on the substrate are illustrated.

In some embodiments, a bottom select gate for NAND strings of each string region may be formed between a first group of slits and a second group of slits. The first group of slits may include one or more gate-line slits/gate-line sub-slits and/or one or more cut slits; and the second group of slits may include one or more gate-line slits/gate-line sub-slits and/or one or more cut slits. The bottom select gate for NAND strings of each string region may be separated from, e.g., electrically separated from, bottom select gates for NAND strings of other string regions, e.g., adjacent string regions, by the first group of slits and/or the second group of slits.

For example, a bottom select gate for NAND strings of the first string region in the first array region may be between a first group of slit(s) and a second group of slit(s); and the first group of slit(s) may include a gate-line slit 163, and the second group of slit(s) may include the cut slit 135-1. That is, a bottom select gate for NAND strings of the first string region in the first array region may be between the gate-line slit 163 and the cut slit 135-1. Further, the bottom select gate for NAND strings of the first string region in the first array region may be separated from, e.g., electrically separated from, a bottom select gate for NAND strings of the second string region in the first array region by the cut slit 135-1.

As another example, a bottom select gate for NAND strings of the second string region in the first array region may be between a first group of slits and a second group of slits. The first group of slit(s) may include the cut slit 135-1, and the second group of slit(s) may include gate-line sub-slits 161-1, 165-1, 161-5, and 161-7 and cut slits 136-1, 136-3, and 136-5. The gate-line sub-slits 161-1, 165-1, 161-5, and 161-7 and cut slits 136-1, 136-3, and 136-5 may be referred to as "gate-line sub-slits 161-1/165-1/161-5/161-7/cut slits 136-1/136-3/136-5." The bottom select gate for NAND strings of the second string region in the first array region may be between the cut slit 135-1 and gate-line sub-slits 161-1/165-1/161-5/161-7/cut slits 136-1/136-3/136-5. Further, the bottom select gate for NAND strings of the second string region in the first array region may be separated from, e.g., electrically separated from, bottom select gates for NAND strings of the first string region and the third string region in the first array region by the cut slit 135-1 and gate-line sub-slits 161-1/165-1/161-5/161-7/cut slits 136-1/136-3/136-5, respectively.

In some embodiments, at least one bottom select gate for NAND strings of each string region a bottom select gate for NAND strings of another string region, by one or more gate-line slits/gate-line sub-slits and/or one or more cut slits. For example, a bottom select gate for NAND strings of the second string region in the first array region may be separated from, e.g., electrically separated from, a bottom select gate for NAND strings of the third string region in the first array region, by the gate-line sub-slits 161-1, 165-1, 161-5, and 161-7 and cut slits 136-1, 136-3, and 136-5.

In some embodiments, at least one bottom select gate for NAND strings of one string region may extend to another string region. For example, one or more bottom select gates for NAND strings of the first string region in the first array region may extend to the second string region and/or the third string region. That is, for NAND strings of the first string region in the first array region, corresponding bottom select gate(s) may extend from the first string region to the second string region and/or the third string region.

In some embodiments, the first finger region may be a wall region for forming a wall structure, and at least one bottom select gate for NAND strings of a string region in the first finger region may extend to a string region in the second finger region or in the third finger region; and the bottom select gate may include a BSG stair in the string region in the second finger region or in the third finger region. For example, at least one bottom select gate for NAND strings of the first string region SR-1 in the first finger region may extend to the third string region SR-3 in the second finger region; and the bottom select gate may include a stair in the third string region SR-3 in the second finger region.

In some embodiments, one or more BSG stairs may be formed in the BSG-stair region. In some embodiments, the BSG-stair region may include a first BSG-stair-level region, region RB-1, and a second BSG-stair-level region, region RB-2; and BSG stairs in the first BSG-stair-level region may be first-level stairs at a first height from a reference plane, e.g., a surface plane of the substrate; and BSG stairs in the second BSG-stair-level region may be second-level stairs at a second height from the reference plane. In some embodiments, the second height may be greater than the first height.

Referring to FIG. 23, the first BSG-stair-level region may include two sub-regions RB-11 and RB-12; and the second BSG-stair-level region may include two sub-regions RB-21 and RB-22. The sub-regions RB-11 and RB-12 may be arranged on two sides of a central plane O1-O2 of the staircase-structure region. The central plane O1-O2 may be, for example, a vertical plane in the middle of the staircase-structure region in X direction and parallel to Y and Z directions. The sub-regions RB-21 and RB-22 may be arranged on two sides of the central plane O1-O2 of the staircase-structure region. A distance from the sub-region RB-21 to the central plane O1-O2 may be greater than a distance from the sub-region RB-11 to the central plane O1-O2; and a distance from the sub-region RB-22 to the central plane O1-O2 may be greater than a distance from the sub-region RB-12 to the central plane O1-O2. Regions and sub-regions R-3, RB-21, RB-11, R-0, RB-12, RB-22, and R-4 may be arranged in such order from one to another along the first direction, and may each extend along the first direction and/or the second direction. That is, the first word-line-stair region, the first sub-region of the second BSG-stair-level region, the first sub-region of the first BSG-stair-level region, the doped well region that includes the doped well, the second sub-region of the first BSG-stair-level region, the second sub-region of the second BSG-stair-level region, and the second word-line-stair region may be arranged along the first direction, and may each extend along the first direction and/or the second direction.

In some embodiments, BSG stairs outside the wall region, i.e., outside the first finger region, may be suitable for forming contacts thereon, and contacts may be formed on the BSG stairs in the second finger region and/or the third finger region.

In the present disclosure, cut slits may be used to distinguish, e.g., separate, string regions, and BSG may extend from a wall region to another finger region outside the wall region. Accordingly, metal winding complexities may be reduced in a central driver setting.

In some embodiments, a BSG stair outside the first finger region, e.g., a BSG stair in the second finger region and/or a BSG stair in the third finger region, may be a stair of a bottom select gate for NAND strings of a string region in the first finger region. Accordingly, a contact may be formed on the BSG stair outside the first finger region, for providing signals for NAND strings of a string region in the first finger region; and at least one bottom select gate for NAND strings of each string region that is in or outside the first finger region may include a BSG stair outside the first finger region and suitable for forming a contact thereon.

In some embodiments, at an inter portion between gate-line slits or between gate-line sub-slits, a plurality of word lines in the first finger region may be connected to, e.g., electrically connected to, a plurality of word lines in the second finger region. For example, at an inter portion between gate-line sub-slits 161-6 and 161-8, a plurality of word lines in the first finger region may be connected to, e.g., electrically connected to, a plurality of word lines in the second finger region.

In some embodiments, at an inter portion between gate-line slits or gate-line sub-slits, a plurality of word lines in the second finger region may be connected to, e.g., electrically connected to, a plurality of word lines in the third finger region. For example, at an inter portion between gate-line sub-slits 162-6 and 162-8, a plurality of word lines in the second finger region may be connected to, e.g., electrically connected to, a plurality of word lines in the third finger region.

The inter portion between gate-line slits or between gate-line sub-slits at which a plurality of word lines in one finger region may be connected to a plurality of word lines in another finger region may include, for example, an inter portion between gate-line sub-slits 161-6 and 161-8, an inter portion between gate-line sub-slits 161-5 and 161-7, an inter portion between gate-line sub-slits 162-5 and 162-7, and/or an inter portion between gate-line sub-slits 162-6 and 162-8.

In some embodiments, cut slits may be symmetric with respect to the central plane O1-O2. For example, referring to FIG. 23, cut slits 135-1 and 135-2 are symmetric with respect to the central plane O1-O2. In other embodiments, cut slits may be asymmetric with respect to the central plane.

In some embodiments, an orthogonal projection of a cut slit on the substrate may include one or more straight-line segments. For example, the orthogonal projection of cut slit 136-5 on the substrate is a straight line segment. In some embodiments, the orthogonal projection of a cut slit, such as cut slit 135-1 or 135-2, on the substrate, may include four straight line segments, and an angle between two adjacent straight line segments may be approximately 90 degrees. In other embodiments, two adjacent straight line segments of an orthogonal projection of a cut slit may be approximately 70 degrees, 75 degrees, 80 degrees, 85 degrees, 90 degrees, 95 degrees, 100 degrees, 105 degrees, 110 degrees, or any other suitable angles. In the present disclosure, an orthogonal projection of a structure on the substrate may be, for example, an orthogonal projection of the structure on a surface plane of the substrate.

In some embodiments, an orthogonal projection of a cut slit, on the substrate, may include one or more curve segments. In some embodiments, an orthogonal projection of a cut slit, on the substrate, may include one or more zig-zag segments. In some embodiments, an orthogonal projection of a cut slit on the substrate may include one or more line segments and one or more curve segments. In some embodiments, an orthogonal projection of a cut slit may include any combination of the above-described shapes and/or any other suitable shapes.

Figure 24:
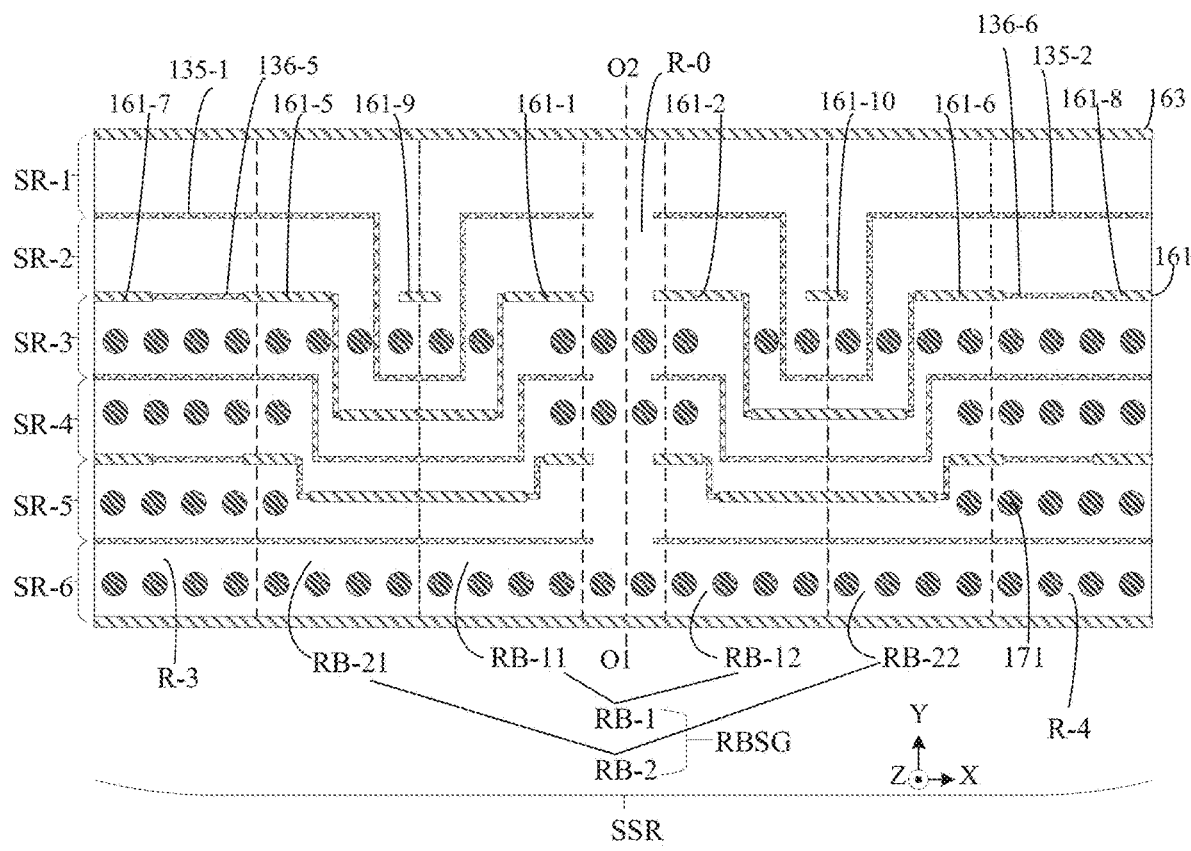
FIG. 24 illustrates structures at certain stage during a process of forming contacts according to various embodiments of the present disclosure.

Returning to FIG. 5, contacts are formed in the BSG structure and the cell-layers structure (S617). Correspondingly, FIG. 24 illustrates structures at certain stage of the process of forming the contacts. FIG. 24 illustrates a schematic view of orthogonal projections of cut slits, gate-line slits, and contacts on the substrate.

Referring to FIG. 24, a plurality of contacts 171 may be formed in the second finger region and the third finger region in the SSR. The plurality of contacts may extend from a top portion of the cell-layers structure to various depths in the first semiconductor structure 110.

In some embodiments, one or more contacts may extend from a top portion of the cell-layers structure to stairs of word lines in the cell-layers structure. In some embodiments, one or more contacts may extend from a top portion of the cell-layers structure to stairs of bottom select gates in the BSG structure. In some embodiments, one or more contacts may extend from a top portion of the cell-layers structure to the substrate 120, e.g., to the doped well 121.

Locations of the contacts described above are merely for illustrative purposes and are not intended to limit the scope of the present disclosure. Locations of the contacts may be chosen according to various application scenarios. For example, locations of the contacts may be chosen according to locations of structures on which the contacts are formed. The structures on which the contacts are formed may include, for example, stairs of word lines, stairs of bottom select gates, and/or one or more doped wells. The number of and shapes of the contacts may be chosen according to various application scenarios.

In some embodiments, a plurality of gate-line slits may exist in a first array region, a second array region, and a staircase-structure region which is a central region between the first array region and the second array region. The first array region, the staircase-structure region, and the second array region may be arranged along the first direction. Certain gate-line slits may extend through the first array regions along the first direction. For example, gate-line slit 163 may extend into and extend through the first array region and the second array region along the first direction. As another example, gate-line slit 161 may extend into and extend through the first array regions and the second array region along the first direction and may include a plurality of gate-line sub-slits. In some embodiment, a gate-line slit, e.g., gate-line slit 163, may include a continuous gate-line slit. In some embodiments, a gate-line slit, e.g., gate-line slit 161, may include a plurality of separated gate-line sub-slits. Finger regions are arranged in a second direction and each extends along the first direction, and in the first array region and the second array region, each finger region may be between two gate-line slits and separated from other finger regions by the two gate-line slits. The plurality of gate-line slits may extend in the third direction from the cell-layers structure, to the BSG structure and to the substrate.

In some embodiments, cut slits may extend through the first array region along the first direction. Cut slits may extend through the second array region along the first direction. For example, cut slit 135-1 may extend into and extend through the first array region along the first direction, and cut slit 135-2 may extend into and extend through the second array region along the first direction. Cut slits may divide each finger region into more than one string regions, each string region may extend along the first direction, and in the first array region and the second array region, each string region may be between two cut slits or between a cut slit and a gate-line slit. Cut slits may extend in the third direction from the BSG structure to the substrate.

Returning to FIG. 5, a second semiconductor structure including a back-end-of-line (BEOL) interconnect layer is formed on the first semiconductor structure (S620). Correspondingly, FIG. 25 illustrates the second semiconductor structure on the first semiconductor structure.

Figure 25:
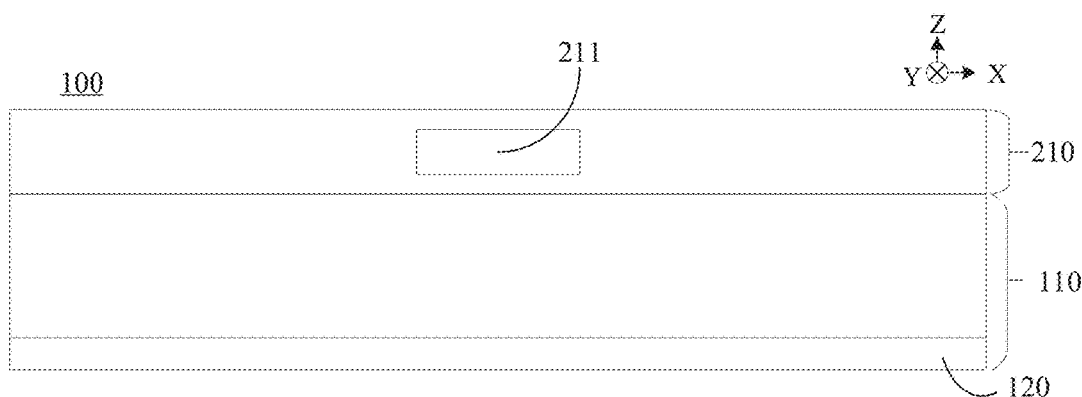
FIG. 25 illustrates an exemplary 3D memory device including a second semiconductor structure on a first semiconductor structure according to various embodiments of the present disclosure.

Referring to FIG. 25, the second semiconductor structure 210 is formed on the first semiconductor structure 110. The first semiconductor structure 110 may include memory cells, stairs for word-lines, contacts, channels, bottom select gates, top select gates, etc. The second semiconductor device 210 may include a back-end-of-line interconnect layer 211. Electrical connections may be formed between contacts in the first semiconductor structure 110 and the back-end-of-line interconnect layer 211.

The present disclosure provides a 3D memory device. FIG. 25 illustrates an exemplary 3D memory device 100 according to various embodiments of the present disclosure.

Referring to FIG. 25, the 3D memory device 100 includes a first semiconductor structure 110 and a second semiconductor structure 210. The second semiconductor structure 210 is formed on the first semiconductor structure 110. The first semiconductor structure 110 may include a substrate 120. The first semiconductor structure 110 may further include, for example, memory cells, NAND strings, stairs for word lines, contacts, channels, bottom select gates, top select gates, stairs for bottom select gates, stairs for top select gates, etc. The second semiconductor device 210 may include a back-end-of-line interconnect layer 211. Electrical connections may be formed between contacts in the first semiconductor structure 110 and the back-end-of-line interconnect layer 211.

In some embodiments, a finger region, such as a first finger region, a second finger region, or a third finger region, may include one or more string regions. Each string region may include a row of NAND strings of the 3D memory device.

For details of the 3D memory device 100, references can be made to above-descriptions of method embodiments and structures, such as descriptions related to FIGS. 1-24.

For example, the first semiconductor structure 110 may include gate-line slits, cut slits, and contacts as described in connection to FIG. 24.

FIG. 26 illustrates another exemplary 3D memory device 100-*a* according to various embodiments of the present disclosure. Referring to FIG. 26, the 3D memory device 100-*a* includes a first semiconductor structure 110-*a* and a second semiconductor structure 210-*a*. The second semiconductor structure 210-*a* is formed on the first semiconductor structure 110-*a*. The first semiconductor structure 110-*a* may include a substrate 120-*a*. The first semiconductor structure 110-*a* may further include, for example, memory cells, NAND strings, stairs for word lines, contacts, channels, bottom select gates, top select gates, stairs for bottom select gates, stairs for top select gates, etc. The second semiconductor device 210-*a* may include a back-end-of-line interconnect layer 211-*a*. Electrical connections may be formed between contacts in the first semiconductor structure 110-*a* and the back-end-of-line interconnect layer 211-*a*.

One or more structures of the 3D memory device 100-*a* may be the same as or similar to structures of above-described 3D memory device(s), such as the 3D memory device 100. For details of the 3D memory device 100-*a*, references can be made to above descriptions for method and device embodiments, such as descriptions about the 3D memory device 100.

FIG. 27 illustrates another schematic view of orthogonal projections of exemplary gate-line slits, cut slits, and contacts in a staircase-structure region in a block of a 3D memory device on the substrate according to various embodiments of the present disclosure. The 3D memory device may be, for example, the 3D memory device 100-*a*.

Referring to FIG. 27, a block of the 3D memory device may include a plurality of finger regions, such as a first finger region, a second finger region, and a third finger region of a block, denoted as regions F-1-*a*, F-2-*a*, and F-3-*a*, respectively. Each finger region may include a plurality of string regions. For example, the first finger region may include two string regions SR-1-*a* and SR-2-*a*; the second finger region may include two string regions SR-3-*a* and SR-4-*a*; and the third finger region may include two string regions SR-5-*a* and SR-6-*a*. Each string region may include a row of NAND strings of the 3D memory device in corresponding array regions (not shown in FIG. 27).

A staircase-structure region SSR-a in a block of the 3D memory device may include a doped well region R-0-*a*; a BSG-stair region RBSG-a; a first word-line-stair region R-3-*a*; and a second word-line-stair region R-4-*a*. The BSG-stair region RBSG-a may include a first BSG-stair-level region RB-1-*a* and a second BSG-stair-level region RB-2-*a*. The first BSG-stair-level region may include, for example, sub-regions RB-11-*a*, RB-12-*a*, and RB-13-*a*. The 3D memory device may include a plurality of gate-line slit 161-*a*, a plurality of cut slits 135-*a*, and a plurality of contact 171-*a*.

In some embodiments, a bottom select gate for NAND strings of each string region may be formed between a first group of slits and a second group of slits. The first group of slits may include one or more gate-line slits/gate-line sub-slits and/or one or more cut slits; and the second group of slits may include one or more gate-line slits/gate-line sub-slits and/or one or more cut slits.

In some embodiments, at least one bottom select gate for NAND strings of a string region may extend to another string region. For example, one or more bottom select gates for NAND strings of the first string region in the first array region and/or the second array region may extend to other string regions, such as the second string region, the third string region, and/or the fourth string region. That is, for NAND strings of the first string region, corresponding bottom select gate(s) may extend from the first string region to other string regions, such as the second string region, the third string region, and/or the fourth string region.

In some embodiments, the first finger region may be a wall region, and at least one bottom select gate for NAND strings of a string region in the first finger region may extend to a string region in the second finger region or in the third finger region; and the bottom select gate may include a BSG stair in the string region in the second finger region or in the third finger region. For example, at least one bottom select gate for NAND strings of the first string-row in the first finger region may extend to the third string region and/or the fourth string region in the second finger region; and the bottom select gate may include a stair in the third string region and/or the fourth string region in the second finger region.

In some embodiments, one or more BSG stairs may be formed in the BSG-stair region. In some embodiments, the BSG-stair region may include a first BSG-stair-level region, region RB-1-*a*, and a second BSG-stair-level region, region RB-2-*a*; and BSG stairs in the first BSG-stair-level region may be first-level stairs at a first height from a reference plane, e.g., a surface plane of the substrate; and BSG stairs in the second BSG-stair-level region may be second-level stairs at a second height from the reference plane. In some embodiments, the second height may be greater than the first height.

Referring to FIG. 27, the first BSG-stair-level region may include sub-regions RB-11-*a*, RB-12-*a*, and RB-13-*a*. The sub-regions RB-11-*a* and RB-13-*a* may be arranged on two sides of the central plane O1-*a*-O2-*a* of the staircase-structure region, respectively; and the sub-region RB-12-*a* may have one portion on one side of the central plane O1-*a*-O2-*a*, and another portion on another side of the central plane O1-*a*-O2-*a*. The doped well region R-0-*a* may have the same dimension as the sub-region RB-12-*a* in X direction; and may have the same coordinate as the sub-region RB-12-*a* in X direction. Along Y direction, a dimension of the doped well region R-0-*a* may be greater than, e.g., twice as, the dimension of the sub-region RB-12-*a* along Y direction; and the doped well region R-0-*a* may have different coordinate in Y direction as compared to the sub-region RB-12-*a* in Y direction. In Y direction, the doped well region R-0-*a* may be farther away from the first finger region than the sub-region RB-12-*a* is. The doped well region R-0-*a* may be in the middle portion staircase-structure region SSR-a in X direction and in the third finger region. In some embodiments, the second BSG-stair-level region RB-2-*a* may have, for example, a comb-shape and/or four branches extending along Y direction; or may have, for example, approximately a comb-shape and/or four branches extending along Y direction. That is, an orthogonal projection of each of sub-regions RB-11-*a*, RB-12-*a*, RB-13-*a*, or the doped well region R-0-*a* on the substrate may be between orthogonal projections of two branches of the second BSG-stair-level region RB-2-*a* on the substrate. For example, an orthogonal projection of sub-region RB-11-*a* on the substrate may be between orthogonal projections of a first branch and a second branch of the second BSG-stair-level region RB-2-*a* on the substrate. Orthogonal projections of sub-region RB-12-*a* and the doped well region R-0-*a* on the substrate may be between orthogonal projections of the second branch and a third branch of the second BSG-stair-level region RB-2-*a* on the substrate. An orthogonal projection of sub-region RB-13-*a* on the substrate may be between orthogonal projections of the third branch and a fourth branch of the second BSG-stair-level region RB-2-*a* on the substrate.

In some embodiments, BSG stairs outside the wall region, i.e., outside the first finger region, may be suitable for forming contacts thereon, and contacts may be formed on the BSG stairs in the second finger region and/or the third finger region.

In some embodiments, a BSG stair outside the first finger region, e.g., a BSG stair in the second finger region and/or a BSG stair in the third finger region, may be a stair of a bottom select gate for NAND strings of a string region in the first finger region. Accordingly, a contact may be formed on the BSG stair outside the first finger region, for providing signals for NAND strings of a string region in the first finger region. For NAND strings of each string region that is in the first finger region, there may be at least one bottom select gate for the NAND strings of the string region in the first finger region, and the at least one bottom select gate may include a BSG stair outside the first finger region and having a contact thereon. For NAND strings of each string region that is outside the first finger region, there may be at least one bottom select gate for the NAND strings of the string region outside the first finger region, and the at least one bottom select gate may include a BSG stair outside the first finger region and having a contact thereon.

In some embodiments, at an inter portion between gate-line slits or between gate-line sub-slits, a plurality of word lines in the first finger region may be connected to, e.g., electrically connected to, a plurality of word lines in the second finger region.

In some embodiments, at an inter portion between gate-line slits or between gate-line sub-slits, a plurality of word lines in the second finger region may be connected to, e.g., electrically connected to, a plurality of word lines in the third finger region.

FIG. 28 illustrates another exemplary 3D memory device 100-*b* according to various embodiments of the present disclosure. Referring to FIG. 28, the 3D memory device 100-*b* includes a first semiconductor structure 110-*b* and a second semiconductor structure 210-*b*. The second semiconductor structure 210-*b* is formed on the first semiconductor structure 110-*b*. The first semiconductor structure 110-*b* includes a substrate 120-*b*. The first semiconductor structure 110-*b* may further include, for example, memory cells, NAND strings, stairs for word lines, contacts, channels, bottom select gates, top select gates, stairs for bottom select gates, stairs for top select gates, etc. The second semiconductor device 210-*b* may include a back-end-of-line interconnect layer 211-*b*. Electrical connections may be formed between contacts in the first semiconductor structure 110-*b* and the back-end-of-line interconnect layer 211-*b*.

One or more structures of the 3D memory device 100-*b* may be the same as or similar to structures of above-described 3D memory device(s), such as the 3D memory device 100. For details of the 3D memory device 100-*b*, references can be made to above descriptions for method and device embodiments, such as descriptions about the 3D memory device 100.

FIG. 29 illustrates another schematic view of orthogonal projections of exemplary gate-line slits, cut slits, and contacts in a staircase-structure region in a block of a 3D memory device on the substrate according to various embodiments of the present disclosure. The 3D memory device may be, for example, the 3D memory device 100-*b*.

Referring to FIG. 29, a block of the 3D memory device may include a plurality of finger regions, such as a first finger region, a second finger region, and a third finger region of a block, denoted as regions F-1-*b*, F-2-*b*, and F-3-*b*, respectively. Each finger region may include a plurality of string regions. For example, the first finger region may include two string regions SR-1-*b* and SR-2-*b*; the second finger region may include two string regions SR-3-*b* and SR-4-*b*; and the third finger region may include two string regions SR-5-*b* and SR-6-*b*. Each string region may include a row of NAND strings of the 3D memory device in corresponding array regions (not shown in FIG. 29).

A staircase-structure region SSR-b in a block of the 3D memory device may include a doped well region R-0-*b*; a BSG-stair region RBSG-b; a first word-line-stair region R-3-*b*; and a second word-line-stair region R-4-*b*. The BSG-stair region RBSG-b may include a first BSG-stair-level region RB-1-*b* and a second BSG-stair-level region RB-2-*b*. The 3D memory device may include a plurality of gate-line slit 161-*b*, a plurality of cut slits 135-*b*, and a plurality of contact 171-*b*.

In some embodiments, a bottom select gate for NAND strings of each string region may be formed between a first group of slits and a second group of slits. The first group of slits may include one or more gate-line slits/gate-line sub-slits and/or one or more cut slits; and the second group of slits may include one or more gate-line slits/gate-line sub-slits and/or one or more cut slits.

In some embodiments, at least one bottom select gate for NAND strings of a string region may extend to another string region. For example, one or more bottom select gates for NAND strings of the first string region in the first array region and/or the second array region may extend to other string regions, such as the second string region, the third string region, and/or the fourth string region. That is, for NAND strings of the first string region, corresponding bottom select gate(s) may extend from the first string region to other string regions, such as the second string region, the third string region, and/or the fourth string region.

In some embodiments, the first finger region may be a wall region, and at least one bottom select gate for NAND strings of a string region in the first finger region may extend to a string region in the second finger region or in the third finger region; and the bottom select gate may include a BSG stair in the string region in the second finger region or in the third finger region. For example, at least one bottom select gate for NAND strings of the first string-row in the first finger region may extend to the third string region and/or the fourth string region in the second finger region; and the bottom select gate may include a BSG stair in the third string region and/or the fourth string region in the second finger region.

In some embodiments, one or more BSG stairs may be formed in the BSG-stair region. In some embodiments, the BSG-stair region may include a first BSG-stair-level region, region RB-1-*b*, and a second BSG-stair-level region, region RB-2-*b*; and BSG stairs in the first BSG-stair-level region may be first-level stairs at a first height from a reference plane, e.g., a surface plane of the substrate; and BSG stairs in the second BSG-stair-level region may be second-level stairs at a second height from the reference plane. In some embodiments, the second height may be greater than the first height.

Referring to FIG. 29, in X-Y plane, the doped well region R-0-*b* may be in the third finger region, and have one portion on one side of the central plane O1-*b*-O2-*b* of the staircase-structure region and another portion on another side of the central plane O1-*b*-O2-*b*. An orthogonal projection of the first BSG-stair-level region RB-1-*b* on the substrate may be adjacent to an orthogonal projection of the doped well region R-0-*b* on the substrate, and may surround three sides of the orthogonal projection of the doped well region R-0-*b*. The first BSG-stair-level region RB-1-*b* may include portions in the fourth string region, the fifth string region, and the sixth string region. An orthogonal projection of the second BSG-stair-level region RB-2-*b* on the substrate may be adjacent to an orthogonal projection of the first BSG-stair-level region RB-1-*b* on the substrate, and may surround at least three sides of the orthogonal projection of the first BSG-stair-level region RB-1-*b* on the substrate. The second BSG-stair-level region RB-2-*b* may include portions in the first string region, the second string region, the third string region, the fourth string region, the fifth string region, and the sixth string region.

In some embodiments, BSG stairs outside the wall region, i.e., outside the first finger region, may be suitable for forming contacts thereon, and contacts may be formed on the BSG stairs in the second finger region and/or the third finger region.

In some embodiments, a BSG stair outside the first finger region, e.g., a BSG stair in the second finger region and/or in the third finger region, may be a stair of a bottom select gate for NAND strings of a string region in the first finger region. Accordingly, a contact may be formed on the BSG stair outside the first finger region, for providing signals for NAND strings of a string region in the first finger region. For NAND strings of each string region that is in the first finger region, there may be at least one bottom select gate for the NAND strings of the string region, and the at least one bottom select gate may include a BSG stair outside the first finger region and having a contact thereon. For NAND strings of each string region that is outside the first finger region, there may be at least one bottom select gate for the NAND strings of the string region, and the at least one bottom select gate may include a BSG stair outside the first finger region and having a contact thereon.

In some embodiments, at an inter portion between gate-line slits or between gate-line sub-slits, a plurality of word lines in the first finger region may be connected to, e.g., electrically connected to, a plurality of word lines in the second finger region.

In some embodiments, at an inter portion between gate-line slits or between gate-line sub-slits, a plurality of word lines in the second finger region may be connected to, e.g., electrically connected to, a plurality of word lines in the third finger region.

The present disclosure provides a central driver structure. The central driver structure may include a structure in the staircase-structure region of a three-dimensional memory device consistent with the present disclosure. The present disclosure provides a method for forming a central driver structure. For details of the method for forming the central driver structure, references can be made to above descriptions of method embodiments and device embodiments.

Although the principles and implementations of the present disclosure are described by using specific embodiments in the specification, the foregoing descriptions of the embodiments are only intended to help understand the method and core idea of the method of the present disclosure. Meanwhile, a person of ordinary skill in the art may make modifications to the specific implementations and application range according to the idea of the present disclosure. In conclusion, the content of the specification should not be construed as a limitation to the present disclosure.

What is claimed is:

1. A memory device, comprising:
a bottom-select-gate (BSG) structure, including cut slits formed vertically through the BSG structure, on a substrate;
a cell-layers structure, formed on the BSG structure; and
gate-line slits, formed vertically through the cell-layers structure and the BSG structure, into the substrate and arranged along a first lateral direction to distinguish a plurality of finger regions, wherein:
the gate-line slits include a first gate-line slit between first and second finger regions of the plurality of finger regions, the first gate-line slit including gate-line sub-slits, and
the first finger region is divided into a first string region and a second string region by a first cut-slit of the cut slits, wherein:
the first cut-slit is formed in the first finger region extending along a second lateral direction and further extended into at least the second finger region along the first lateral direction, and
at least one BSG defined by the first cut-slit is located in at least the second finger region to connect to cell strings in the first string region through an inter-portion between adjacent gate-line sub-slits of the first gate-line slit.

2. The memory device according to claim 1, wherein:
the cut slits further include a second cut-slit formed in the second finger region and connecting to a gate-line sub-slit of the first gate-line slit.

3. The memory device according to claim 2, wherein:
the second cut-slit defines another at least one BSG located in at least the second finger region to connect to cell strings in the second string region of the first finger region through a corresponding inter-portion between corresponding adjacent gate-line sub-slits of the first gate-line slit.

4. The memory device according to claim 3, wherein:
the second cut-slit is further extended into another finger region of the plurality of finger regions along the first lateral direction to further provide an additional BSG located in the another finger region to connect to the cell strings in the second string region of the first finger region.

5. The memory device according to claim 1, wherein:
the first cut-slit is further extended into another finger region of the plurality of finger regions along the first lateral direction to further provide an additional BSG located in the another finger region to connect to the cell strings in the first string region.

6. The memory device according to claim 1, wherein:
each finger region of the plurality of finger regions is divided into two or more string regions.

7. The memory device according to claim 1, further including:
dummy channels, formed in the plurality of finger regions over the substrate; and
contacts, formed on BSGs of the BSG structure in the plurality of finger regions excluding the first finger region.

8. The memory device according to claim 1, wherein:
the first finger region is defined between a continuous gate-line slit and the first gate-line slit including the gate-line sub-slits, and
a wall structure is formed in the first finger region over the substrate, wherein the wall structure includes a stack structure of alternating electrode/insulating layer pairs.

9. The memory device according to claim 1, wherein:
an additional gate-line sub-slit is formed within a finger region connecting to one or more cut slits to form corresponding string regions.

10. The memory device according to claim 1, further including:
another BSG structure, wherein:
the substrate includes a staircase-structure region and a doped well is formed in the staircase-structure region of the substrate, and
the BSG structure and the another BSG structure are formed on the staircase-structure region of the substrate symmetrically based on the doped well.

11. A method for forming a memory device, comprising:
forming a bottom-select-gate (BSG) structure on a substrate;
forming cut slits vertically through the BSG structure on the substrate;
forming a cell-layers structure on the BSG structure; and
forming gate-line slits that are vertically through the cell-layers structure and the BSG structure, into the substrate and arranged along a first lateral direction to distinguish a plurality of finger regions, wherein:

the gate-line slits include a first gate-line slit between first and second finger regions of the plurality of finger regions, the first gate-line slit including gate-line sub-slits, and the first finger region is divided into a first string region and a second string region by a first cut-slit of the cut slits, wherein:

the first cut-slit is formed in the first finger region along a second lateral direction and further extended into at least the second finger region along the first lateral direction, and at least one BSG defined by the first cut-slit is located in at least the second finger region to connect to cell strings in the first string region through an inter-portion between adjacent gate-line sub-slits of the first gate-line slit.

12. The method according to claim 11, wherein:

the cut slits further include a second cut-slit formed in the second finger region and connecting to a gate-line sub-slit of the first gate-line slit.

13. The method according to claim 12, wherein:

the second cut-slit defines another at least one BSG located in at least the second finger region to connect to cell strings in the second string region of the first finger region through a corresponding inter-portion between corresponding adjacent gate-line sub-slits of the first gate-line slit.

14. The method according to claim 13, wherein:

the second cut-slit is further extended into another finger region of the plurality of finger regions along the first lateral direction to further provide an additional BSG located in the another finger region to connect to the cell strings in the second string region of the first finger region.

15. The method according to claim 11, wherein:

the first cut-slit is further extended into another finger region of the plurality of finger regions along the first lateral direction to further provide an additional BSG located in the another finger region to connect to the cell strings in the first string region.

16. The method according to claim 11, wherein:

each finger region of the plurality of finger regions is divided into two or more string regions.

17. The method according to claim 11, further including:

forming dummy channels in the plurality of finger regions over the substrate; and forming contacts on BSGs in the plurality of finger regions excluding the first finger region.

18. The method according to claim 11, wherein:

the first finger region is defined between a continuous gate-line slit and the first gate-line slit including the gate-line sub-slits, and a wall structure is formed in the first finger region over the substrate, wherein the wall structure includes a stack structure of alternating electrode/insulating layer pairs.

19. The method according to claim 11, wherein:

an additional gate-line sub-slit is formed within a finger region connecting to one or more cut slits to form corresponding string regions.

20. The method according to claim 11, further including:

forming another BSG structure, wherein:

the substrate includes a staircase-structure region and a doped well is formed in the staircase-structure region of the substrate, and the BSG structure and the another BSG structure are formed on the staircase-structure region of the substrate symmetrically based on the doped well.

* * * * *